United States Patent
Lee et al.

(10) Patent No.: US 12,328,875 B2
(45) Date of Patent: Jun. 10, 2025

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Sangdon Lee, Hwaseong-si (KR); Jiwon Kim, Hwaseong-si (KR); Sung-Min Hwang, Hwaseong-si (KR); Sukkang Sung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 527 days.

(21) Appl. No.: 17/552,812

(22) Filed: Dec. 16, 2021

(65) Prior Publication Data

US 2022/0375959 A1 Nov. 24, 2022

(30) Foreign Application Priority Data

May 18, 2021 (KR) .................. 10-2021-0063978

(51) Int. Cl.
*H10B 43/20* (2023.01)
*H10B 43/35* (2023.01)
*H10B 43/40* (2023.01)

(52) U.S. Cl.
CPC ............. *H10B 43/20* (2023.02); *H10B 43/35* (2023.02); *H10B 43/40* (2023.02)

(58) Field of Classification Search
CPC ........ H10B 43/20; H10B 43/35; H10B 43/40; H10B 43/27; H10B 43/10; H10B 41/27;

(Continued)

(56) References Cited

U.S. PATENT DOCUMENTS 10,020,319 B2 7/2018 Baba
10,096,616 B2 * 10/2018 Lee .................. H10B 43/35

(Continued)

FOREIGN PATENT DOCUMENTS

JP 2020-126888 A 8/2020
KR 10-2020-0107341 A 9/2020

OTHER PUBLICATIONS

Office Action dated Apr. 29, 2025 issued in Korean Patent Application No. 10-2021-0063978.

*Primary Examiner* — Khaja Ahmad
*Assistant Examiner* — Khatib A Rahman
(74) *Attorney, Agent, or Firm* — MORGAN, LEWIS & BOCKIUS LLP

(57) ABSTRACT

Disclosed are a three-dimensional semiconductor memory device and an electronic system including the same. The device includes a substrate, a cell array structure provided on the substrate to include a plurality of stacked electrodes spaced apart from each other, an uppermost one of the electrodes being a first string selection line, a vertical channel structure provided to penetrate the cell array structure and connected to the substrate, a conductive pad provided in an upper portion of the vertical channel structure, a bit line on the cell array structure, a bit line contact electrically connecting the bit line to the conductive pad, and a cutting structure penetrating the first string selection line. The cutting structure penetrates a portion of the conductive pad. A bottom surface of the bit line contact includes first and second bottom surfaces in contact with the conductive pad and the cutting structure, respectively.

20 Claims, 29 Drawing Sheets

(58) Field of Classification Search
CPC . H10B 41/30; H10B 43/30; H01L 21/823475; H10H 20/8314
See application file for complete search history.

(56) References Cited

U.S. PATENT DOCUMENTS

| | | | |
|---|---|---|---|
| 10,373,653 B2* | 8/2019 | Lee | G11C 13/00 |
| 10,431,594 B2 | 10/2019 | Kim | |
| 10,438,998 B2* | 10/2019 | Lee | H10B 63/30 |
| 10,490,564 B2 | 11/2019 | Mushiga et al. | |
| 10,535,599 B2* | 1/2020 | Kim | H10B 69/00 |
| 10,546,876 B2* | 1/2020 | Lee | H10B 43/40 |
| 10,685,979 B1 | 6/2020 | Lu et al. | |
| 10,797,074 B2* | 10/2020 | Yang | H10B 43/35 |
| 10,804,289 B2* | 10/2020 | Yang | H10B 43/10 |
| 10,811,430 B2* | 10/2020 | Baek | H10D 30/694 |
| 10,818,678 B2* | 10/2020 | Hwang | H10B 41/40 |
| 10,818,687 B2* | 10/2020 | Kim | H10B 41/40 |
| 11,107,826 B2 | 8/2021 | Lee et al. | |
| 2018/0277476 A1 | 9/2018 | Hagishima | |
| 2020/0203366 A1 | 6/2020 | Kim et al. | |
| 2020/0251488 A1* | 8/2020 | Iwai | H10B 43/27 |
| 2020/0273876 A1* | 8/2020 | Kashima | H10B 43/27 |
| 2020/0303397 A1 | 9/2020 | Cui et al. | |

\* cited by examiner

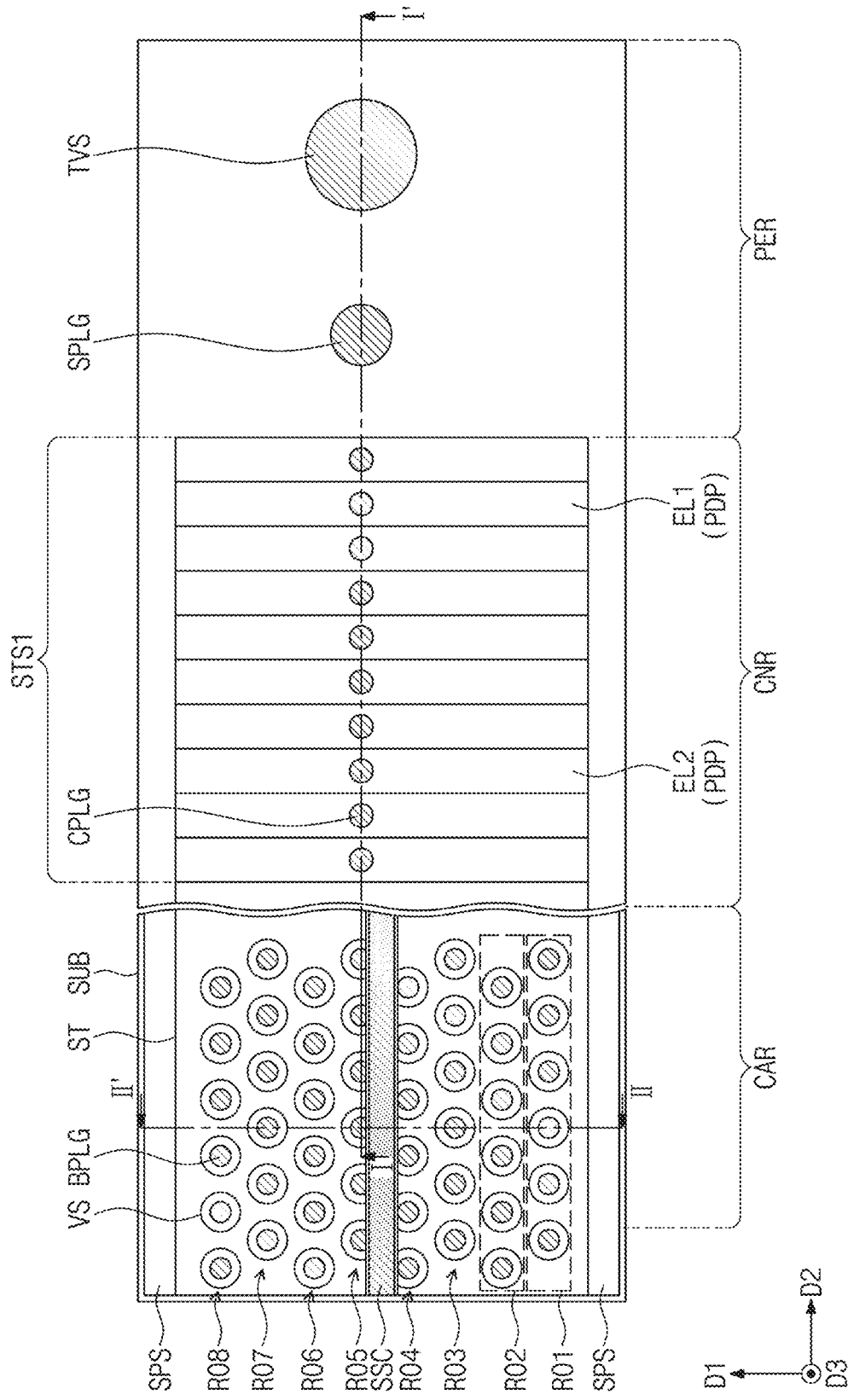

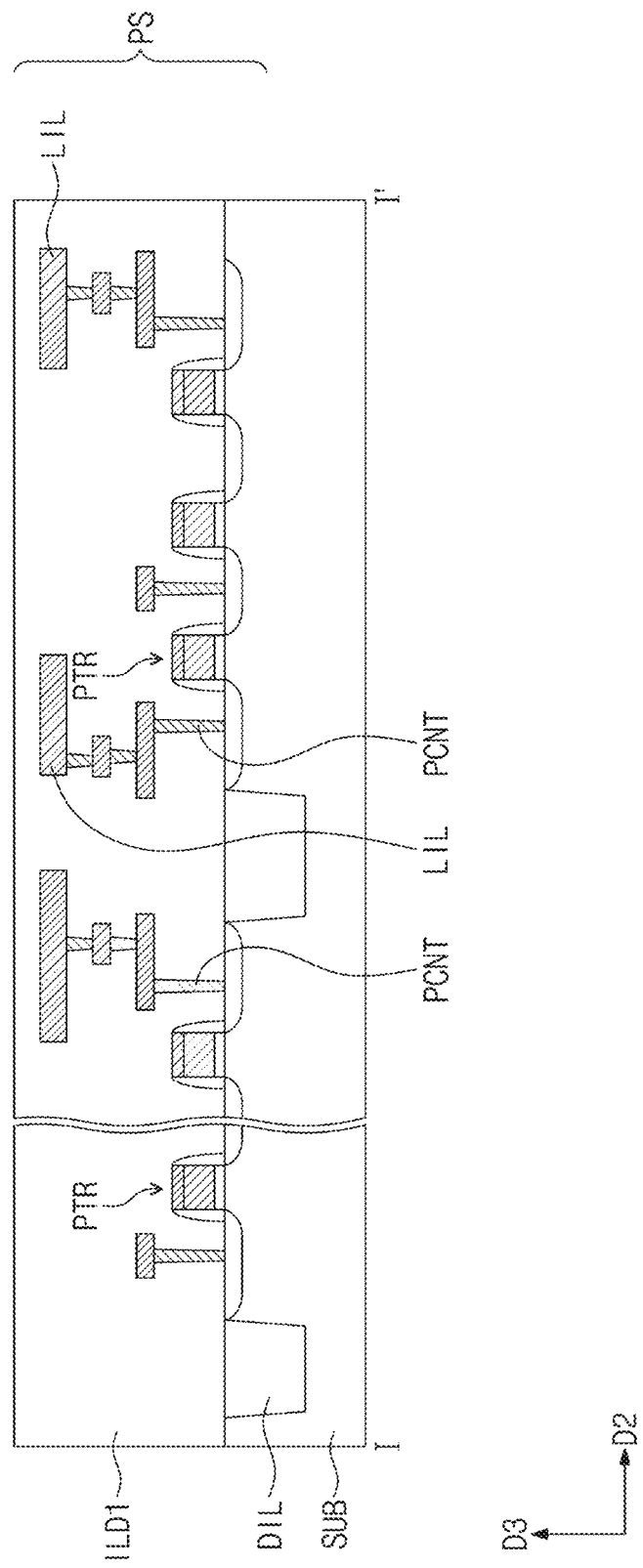

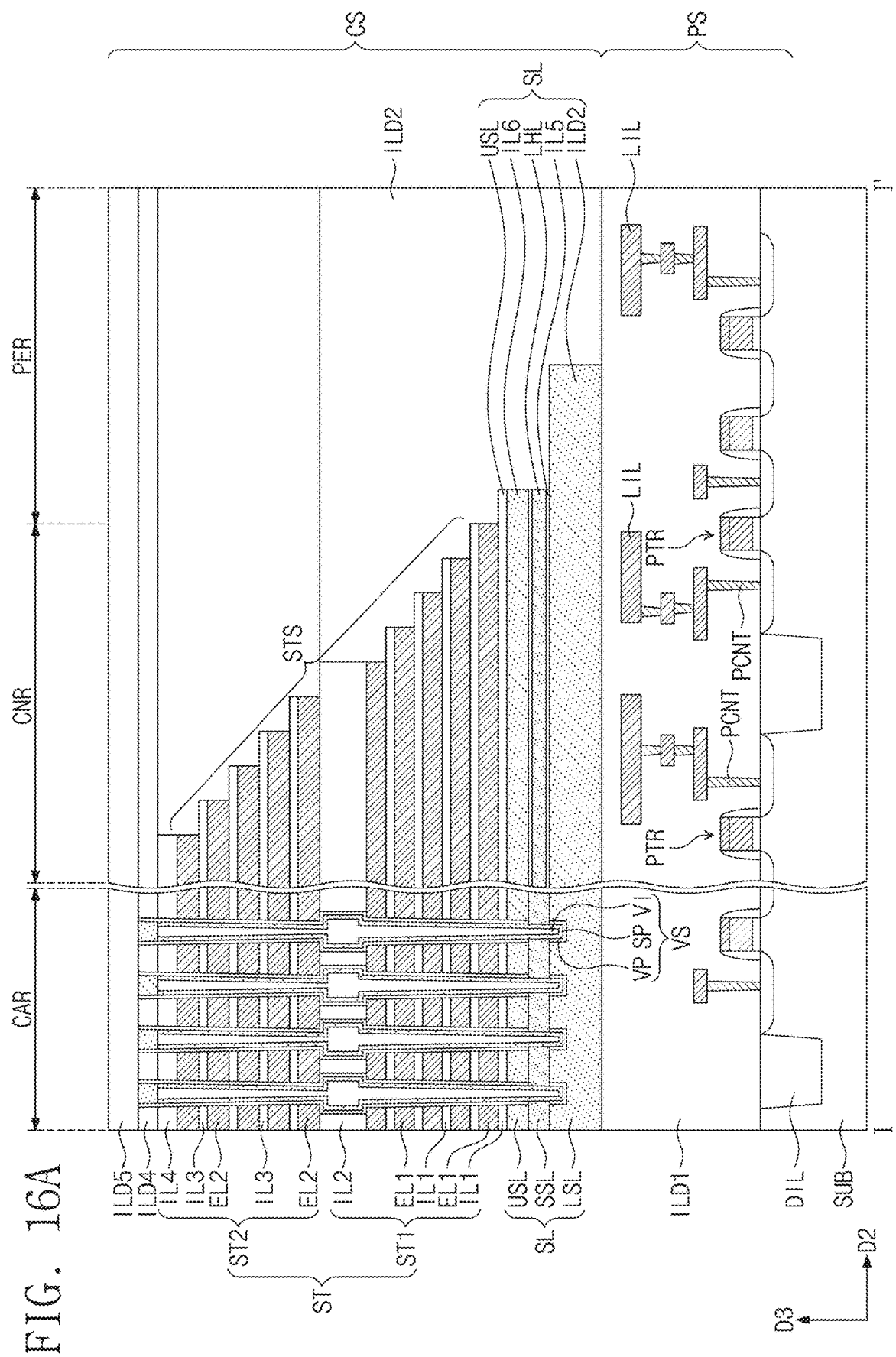

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0063978, filed on May 18, 2021, in the Korean Intellectual Property Office, the entire contents of which are hereby incorporated by reference.

BACKGROUND

Some example embodiments relate to a three-dimensional semiconductor memory device and an electronic system including the same.

A semiconductor device capable of storing a large amount of data is required or used as a part of an electronic system. Accordingly, many researches are being conducted to increase a data storing capacity of the semiconductor device. For example, semiconductor devices having three-dimensionally arranged memory cells, instead of two-dimensionally arranged memory cells, are being suggested.

SUMMARY

Some example embodiments of inventive concepts provide a three-dimensional semiconductor memory device with increased integration density and improved reliability.

Alternatively or additionally, some example embodiments of inventive concepts provide a method of fabricating a three-dimensional semiconductor memory device with increased integration density and improved reliability.

According to some example embodiments of inventive concepts, a semiconductor device may include a substrate, a cell array structure on the substrate, the cell array structure comprising a plurality of electrodes, which are stacked and spaced apart from each other, an uppermost one of the plurality of electrodes corresponding to a first string selection line, a vertical channel structure penetrating the cell array structure and connected to the substrate, a conductive pad in an upper portion of the vertical channel structure, a bit line on the cell array structure, a bit line contact electrically connecting the bit line to the conductive pad, and a cutting structure penetrating the electrode corresponding to the first string selection line. The cutting structure penetrates a portion of the conductive pad, and a bottom surface of the bit line contact comprises a first bottom surface contacting the conductive pad, and a second bottom surface contacting the cutting structure.

According to some example embodiments of inventive concepts, a semiconductor device may include a substrate, a cell array structure on the substrate, the cell array structure comprising a plurality of electrodes which are stacked to be spaced apart from each other, an uppermost one of the plurality of electrodes corresponding to a string selection line, vertical channel structures provided to penetrate the cell array structure and connected to the substrate, and a cutting structure provided to penetrate the string selection line. The cutting structure has a line shape extending in a first direction, the vertical channel structures arranged in the first direction constitute rows, the rows comprise a first row and a second row, which are adjacent to each other in a second direction with the cutting structure interposed between the first row and the second row, and the second direction crosses the first direction, the cutting structure vertically overlaps a portion of each of the vertical channel structures of the first row, and the cutting structure vertically overlaps a portion of each of the vertical channel structures of the second row.

According to some example embodiments of inventive concepts, an electronic system may include a semiconductor device including an input/output pad, which is electrically connected to peripheral circuits, and a controller electrically connected to the semiconductor device through the input/output pad and configured to control the semiconductor device. The semiconductor device comprises a lower level layer including a first substrate and the peripheral circuits on the first substrate, and an upper level layer on the lower level layer. The upper level layer includes a second substrate on the lower level layer, a cell array structure on the second substrate, the cell array structure comprising a plurality of electrodes, which are stacked to be spaced apart from each other, an uppermost one of the plurality of electrodes corresponding to a string selection line, a vertical channel structure penetrating the cell array structure and connected to the second substrate, and a cutting structure penetrating the string selection line. The cutting structure comprises a first cutting layer and a second cutting layer on the first cutting layer, and the second cutting layer comprises a material having an etch selectivity with respect to the first cutting layer.

BRIEF DESCRIPTION OF THE DRAWINGS

FIG. 5 is a plan view illustrating a semiconductor device according to some example embodiments of inventive concepts.

FIGS. 9A, 10A, 11A, 12A, 13A, 14A, 15A, and 16A are sectional views, which are taken along the line I-I' of FIG. 5 to illustrate a method of fabricating a semiconductor device according to some example embodiments of inventive concepts.

DETAILED DESCRIPTION OF SOME EXAMPLE EMBODIMENTS

Example embodiments of inventive concepts will now be described more fully with reference to the accompanying drawings, in which example embodiments are shown.

Figure 1:
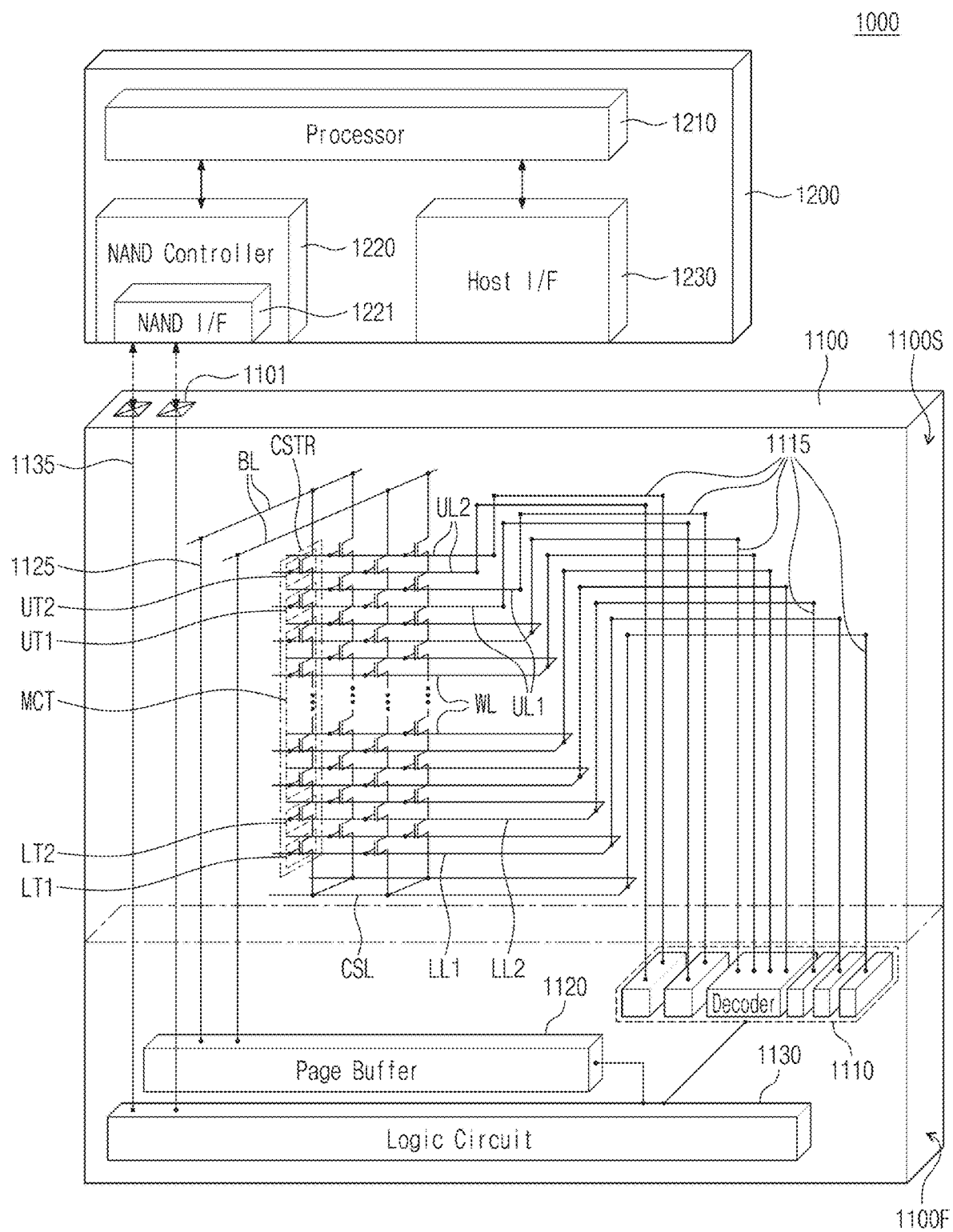
FIG. 1 is a diagram schematically illustrating an electronic system including a semiconductor device according to some example embodiments of inventive concepts.

FIG. 1 is a diagram schematically illustrating an electronic system including a semiconductor device according to some example embodiments of inventive concepts.

Referring to FIG. 1, an electronic system 1000 according to some example embodiments of inventive concepts may include a semiconductor device 1100 and a controller 1200 electrically connected to the semiconductor device 1100. The electronic system 1000 may be or may include a storage device including one or more semiconductor devices 1100 or an electronic device including the storage device. For example, the electronic system 1000 may be or may include at least one of a solid state drive (SSD) device, a universal serial bus (USB), a computing system, a medical system, or a communication system, in which at least one semiconductor device 1100 is provided.

The semiconductor device 1100 may be or may include a nonvolatile memory device (e.g., a NAND FLASH memory device). The semiconductor device 1100 may include a first structure 1100F and a second structure 1100S on the first structure 1100F. In some example embodiments, the first structure 1100F may be disposed beside the second structure 1100S. The first structure 1100F may be or include a peripheral circuit structure including a decoder circuit 1110, a page buffer 1120, and a logic circuit 1130. The second structure 1100S may be or may include a memory cell structure including a bit line BL corresponding to columns, a common source line CSL, word lines WL corresponding to rows, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed and for example may have various electrical properties, according to example embodiments.

In some example embodiments, the upper transistors UT1 and UT2 may include at least one string selection transistor, and the lower transistors LT1 and LT2 may include at least one ground selection transistor. The gate lower lines LL1 and LL2 may be respectively used as or correspond to gate electrodes of the lower transistors LT1 and LT2. The word lines WL may be respectively used as or correspond to gate electrodes of the memory cell transistors MCT, and the gate upper lines UL1 and UL2 may be respectively used as or correspond to gate electrodes of the upper transistors UT1 and UT2.

In some example embodiments, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer 1120 through second connection lines 1125, which are extended from the first structure 1100F to the second structure 1100S.

In the first structure 1100F, the decoder circuit 1110 and the page buffer 1120 may be configured to perform a control operation on at least selected one of the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is extended from the first structure 1100F to the second structure 1100S.

The controller 1200 may include a processor 1210, a NAND controller 1220, and a host interface 1230. In some example embodiments, the electronic system 1000 may include a plurality of semiconductor devices 1100, and in some example embodiments, the controller 1200 may control the semiconductor devices 1100.

The processor 1210 may control overall or at least some of operations the electronic system 1000 including the controller 1200. The processor 1210 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be configured to transmit and receive control commands, which are used to control the semiconductor device 1100, data, which are written in or read from the memory cell transistors MCT of the semiconductor device 1100, and so forth. The host interface 1230 may be configured to allow for communication between the electronic system 1000 and an external host. When the processor 1210 receives a control command transmitted from the external host through the host interface 1230, the processor 1210 may control the semiconductor device 1100 in response to the control command.

Figure 2:
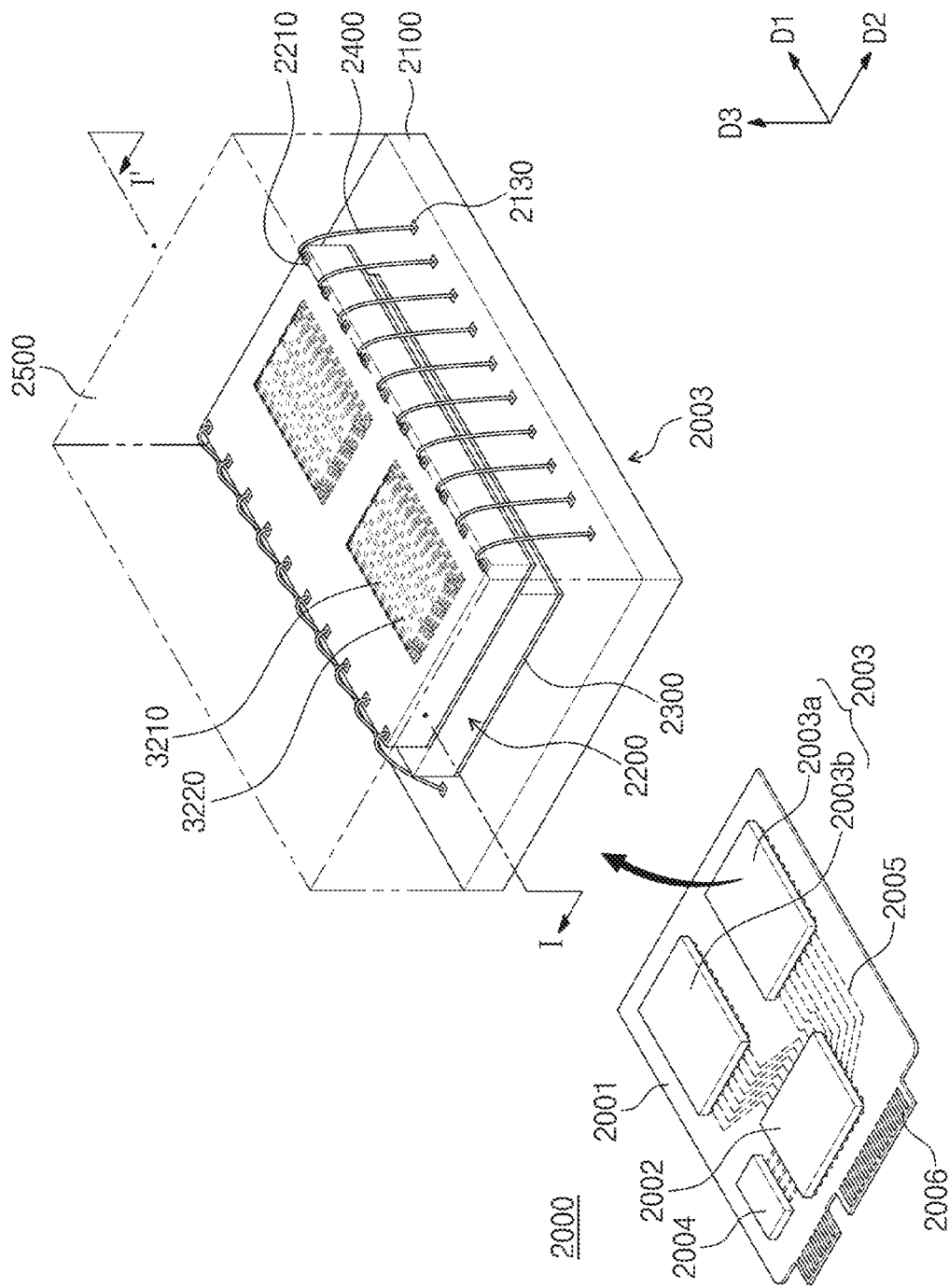
FIG. 2 is a perspective view schematically illustrating an electronic system including a semiconductor device, according to some example embodiments of inventive concepts.

FIG. 2 is a perspective view schematically illustrating an electronic system including a semiconductor device according to some example embodiments of inventive concepts.

Referring to FIG. 2, an electronic system 2000 according to some example embodiments of inventive concepts may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 by interconnection patterns 2005, which are formed in the main substrate 2001.

The main substrate 2001 may include a connector 2006, which includes a plurality of pins coupled to an external host. In the connector 2006, the number and/or the arrangement of the pins may be changed depending on a communication interface between the electronic system 2000 and the external host. In some example embodiments, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In some example embodiments, the electronic system 2000 may be driven by a power, which is supplied from the external host through the connector 2006. The electronic system 2000 may further include a Power Management Integrated Circuit (PMIC) that is configured to distribute a power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be or correspond to a buffer memory, which relieves or helps to relieve technical difficulties caused by a difference in speed between the semiconductor package 2003, which serves as a data storage device, and an external host. In some example embodiments, the DRAM 2004 in the electronic system 2000 may serve as a cache memory and may be used as a storage space, which is configured to store data temporarily during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be or may include a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1A. Each of the semiconductor chips 2200 may include gate stacks 3210 and vertical channel structures 3220. Each of the semiconductor chips 2200 may include a semiconductor device, which will be described below, according to some example embodiments of inventive concepts.

In some example embodiments, the connection structure 2400 may be or may include a bonding wire, which is provided to electrically connect the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. Alternatively or additionally, in each of the first and second semiconductor packages 2003a and 2003b, the semiconductor chips 2200 may be electrically connected to each other by a connection structure including through-silicon vias (TSVs), not by the connection structure 2400 provided in the form of bonding wires.

In some example embodiments, the controller 2002 and the semiconductor chips 2200 may be included in a single package. In some example embodiments, the controller 2002 and the semiconductor chips 2200 may be mounted on an additional interposer substrate different from the main substrate 2001 and may be connected to each other through interconnection lines, which are provided in the interposer substrate.

Figure 3:
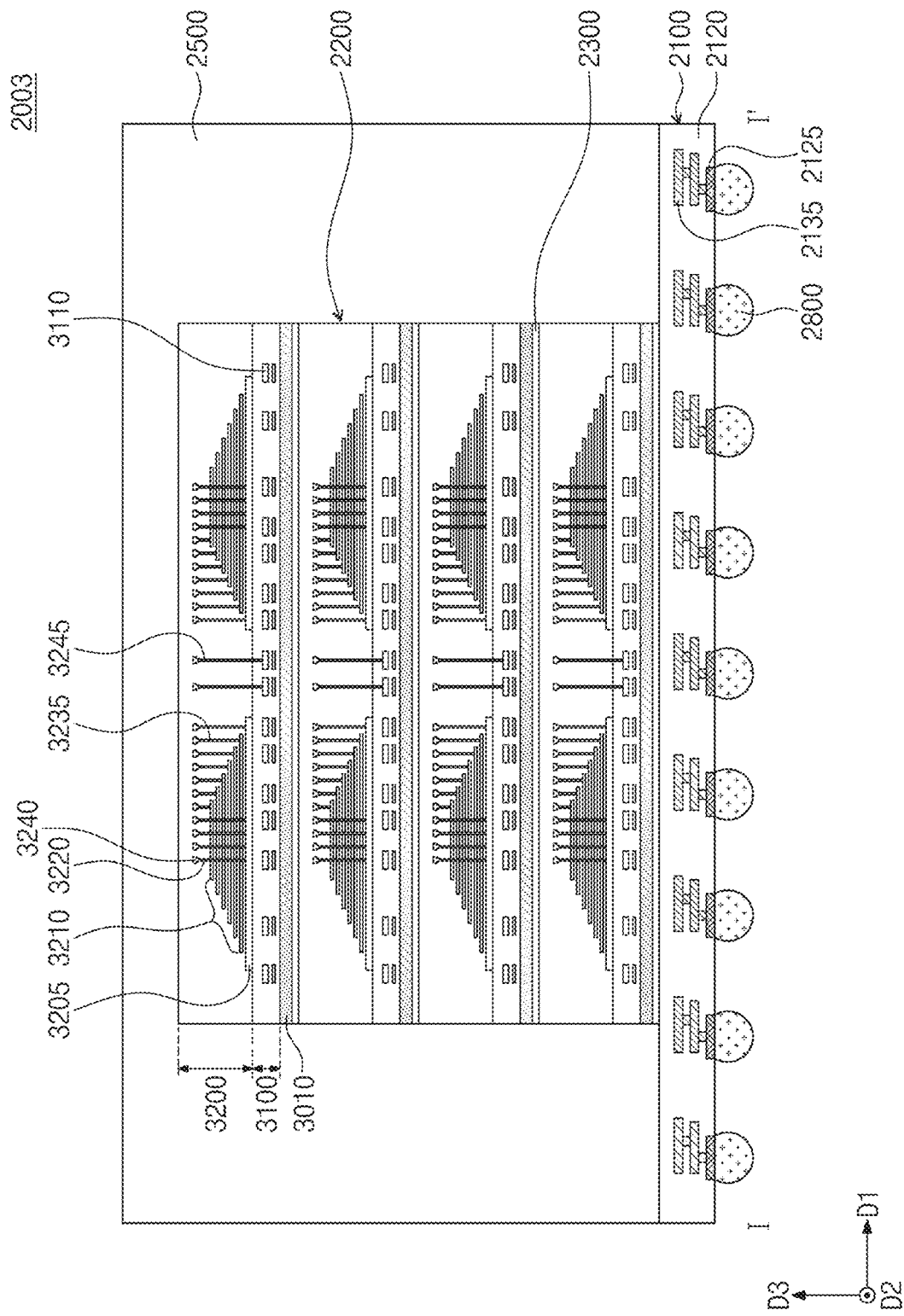
FIGS. 3 and 4 are sectional views schematically illustrating semiconductor packages according to some embodiments of inventive concepts.
Figure 4:
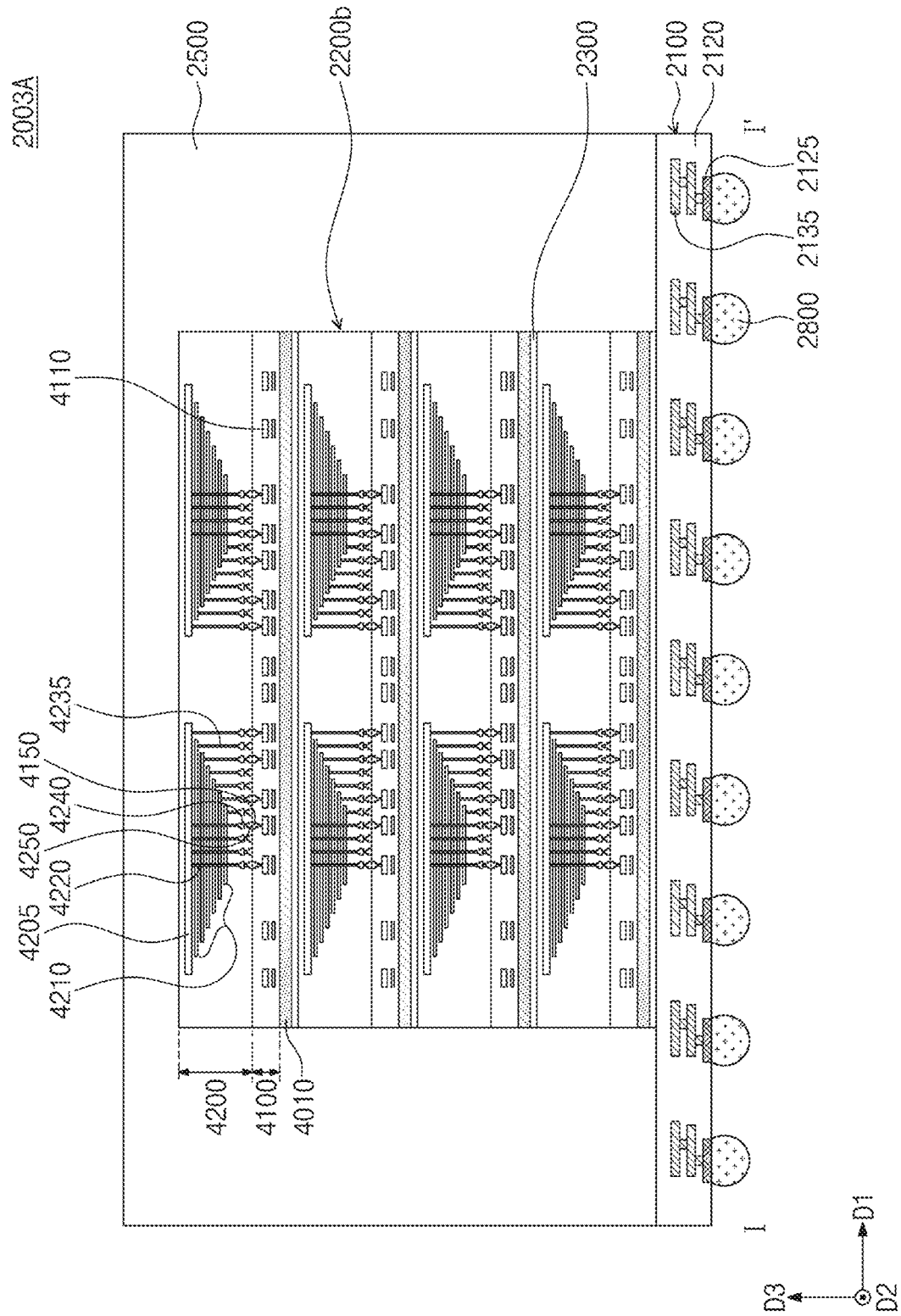

FIGS. 3 and 4 are sectional views, each of which schematically illustrates a semiconductor package according to some example embodiments of inventive concepts. FIGS. 3 and 4 are sectional views, which are taken along a line I-I' of FIG. 2, and illustrate two different examples of the semiconductor package of FIG. 2.

Referring to FIG. 3, the package substrate 2100 of the semiconductor package 2003 may be or may include a printed circuit board. The package substrate 2100 may include a package substrate body portion 2120, the package upper pads 2130 (e.g., see FIG. 2), which are disposed on a top surface of the package substrate body portion 2120, lower pads 2125, which are disposed on or exposed through a bottom surface of the package substrate body portion 2120, and internal lines 2135, which are disposed in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005 of the main substrate 2001 of the electronic system 2000 shown in FIG. 2 through conductive connecting portions 2800.

Each of the semiconductor chips 2200 may include a semiconductor substrate 3010 and a first structure 3100 and a second structure 3200, which are sequentially stacked on the semiconductor substrate 3010. The first structure 3100 may include a peripheral circuit region including peripheral lines 3110. The second structure 3200 may include a source structure 3205, a stack 3210 on the source structure 3205, the vertical channel structures 3220 penetrating the stack 3210, bit lines 3240 electrically connected to the vertical channel structures 3220, and cell contact plugs 3235 electrically connected to the word lines WL (e.g., see FIG. 1) of the stack 3210.

Each of the semiconductor chips 2200 may include a penetration line 3245, which is electrically connected to the peripheral lines 3110 of the first structure 3100 and is extended into the second structure 3200. The penetration line 3245 may be disposed outside the stack 3210, and in some example embodiments, the penetration line 3245 may be provided to further penetrate the stack 3210. Each of the semiconductor chips 2200 may further include the input/output pad 2210 (e.g., see FIG. 2), which is electrically connected to the peripheral lines 3110 of the first structure 3100.

Referring now to FIG. 4, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded to the first structure 4100 in a wafer bonding manner.

The first structure 4100 may include a peripheral circuit region including a peripheral line 4110 and first junction structures 4150. The second structure 4200 may include a source structure 4205, a stack 4210 between the source structure 4205 and the first structure 4100, vertical channel structures 4220 penetrating the stack 4210, bit lines 4240 electrically connected to the vertical channel structures

4220, and cell contact plugs 4235 electrically connected to the word lines WL (e.g., see FIG. 1) of the stack 4210.

The bit lines 4240 and the cell contact plugs 4235 may be electrically connected to the first junction structures 4150 of the first structure 4100 through second junction structures 4250. The second junction structures 4250 may be provided to be in contact with the first junction structures 4150, respectively, or may be bonded to the first junction structures 4150, respectively. The first junction structures 4150 and the second junction structures 4250 may be formed of or may include copper (Cu); however, example embodiments are not limited thereto.

Each of the semiconductor chips 2200a may further include the input/output pad 2210 (e.g., see FIG. 2), which is electrically connected to the peripheral line 4110 of the first structure 4100.

The semiconductor chips 2200 of FIG. 3 may be electrically connected to each other through the connection structures 2400, which are provided in the form of bonding wires. The semiconductor chips 2200a of FIG. 4 may be electrically connected to each other through the connection structures 2400, which are provided in the form of bonding wires. Alternatively or additionally, in some example embodiments, semiconductor chips, which are stacked in in a single semiconductor package, such as the semiconductor chips 2200 of FIG. 3 or the semiconductor chips 2200a of FIG. 4, may be electrically connected to each other by throughsilicon vias (TSVs).

The first structure 3100 of FIG. 3 and the first structure 4100 of FIG. 4 may correspond to a lower level layer in embodiments to be described below, and the second structure 3200 of FIG. 3 and the second structure 4200 of FIG. 4 may correspond to an upper level layer in the embodiments to be described below.

Figure 6A:
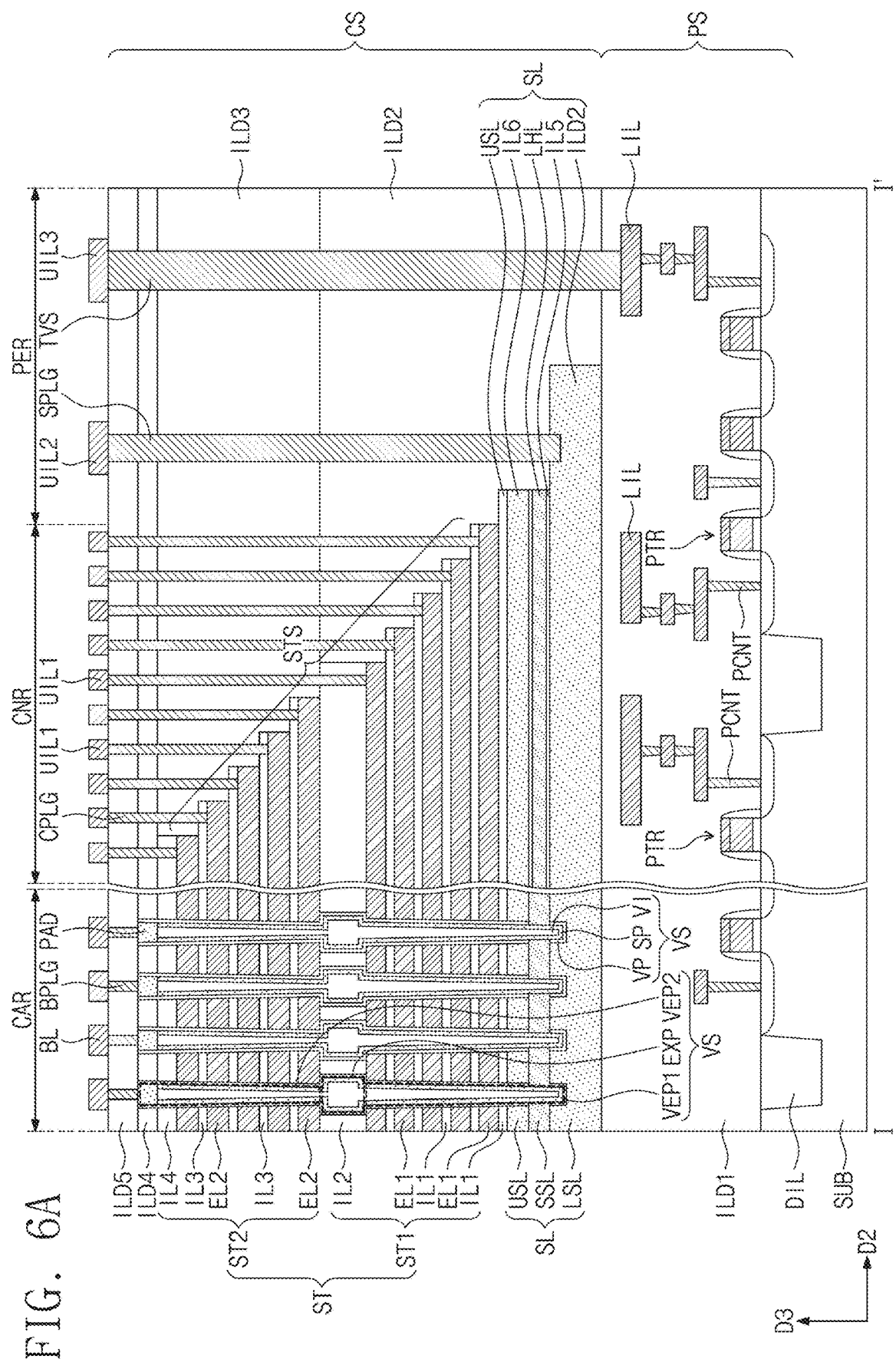
FIG. 6A is a sectional view taken along a line I-I' of FIG. 5.
Figure 6B:
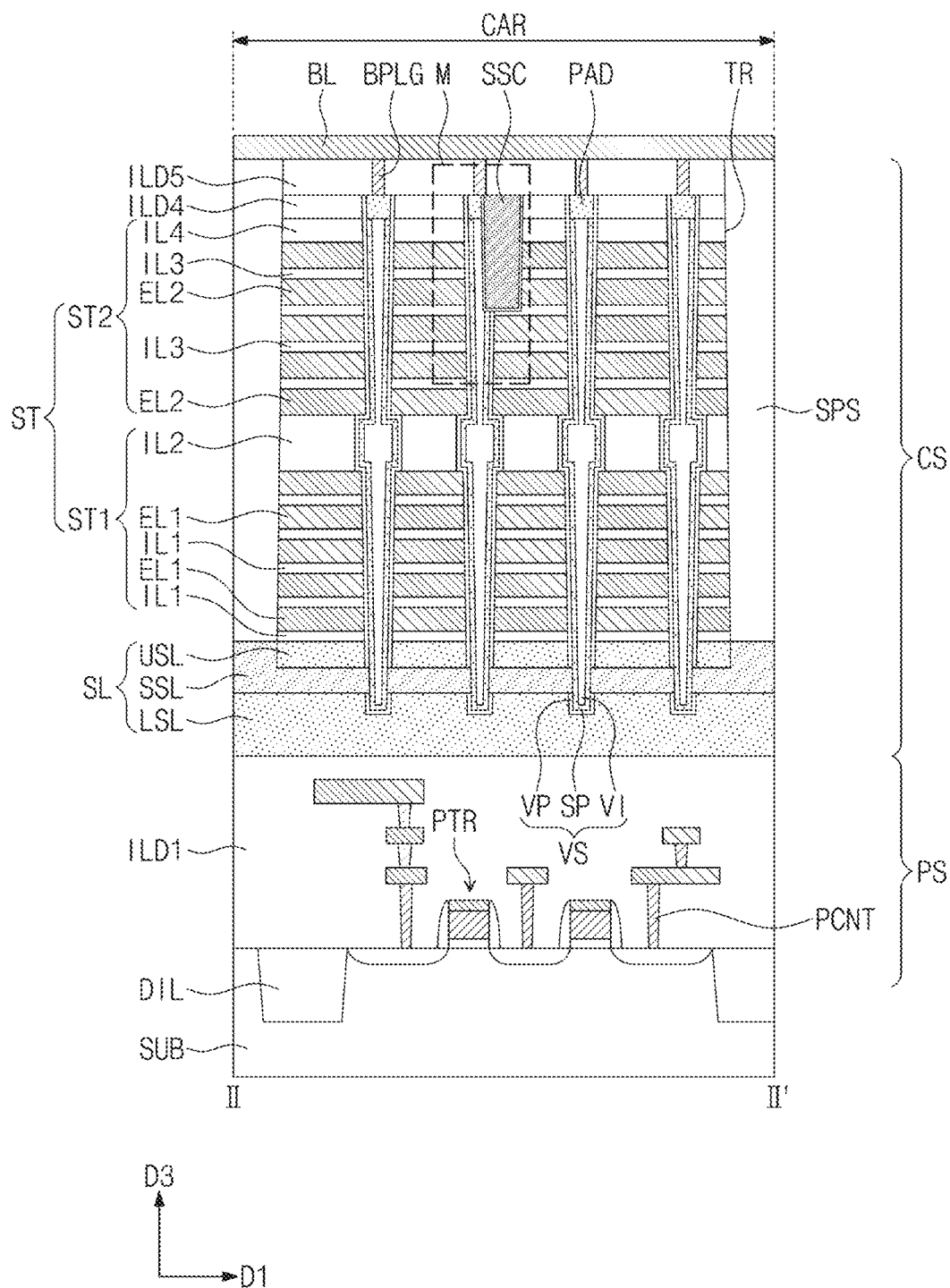
FIG. 6B is a sectional view taken along a line II-II' of FIG. 5.
Figure 7:
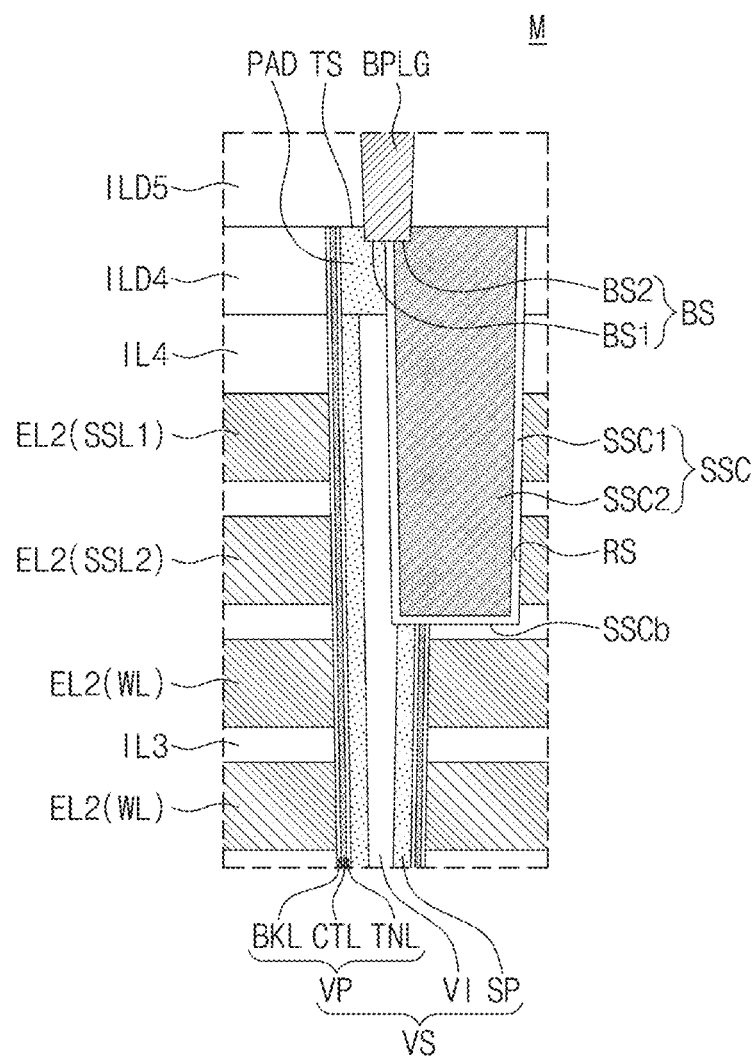
FIG. 7 is an enlarged sectional view illustrating a portion 'M' of FIG. 6B.

FIG. 5 is a plan view illustrating a semiconductor device according to some example embodiments of inventive concepts. FIG. 6A is a sectional view taken along a line I-I' of FIG. 5. FIG. 6B is a sectional view taken along a line II-II' of FIG. 5. FIG. 7 is an enlarged sectional view illustrating a portion 'M' of FIG. 6B.

Referring to FIGS. 5, 6A, and 6B, a lower level layer PS including peripheral transistors PTR may be disposed on a first substrate SUB. An upper level layer CS including a cell array structure ST may be disposed on the lower level layer PS. The first substrate SUB may be a single-crystalline substrate and/or may include a silicon substrate, a silicon germanium substrate, a germanium substrate, or a single crystalline epitaxial layer grown on a single crystalline silicon substrate, and may be doped, e.g., may be lightly doped; however, example embodiments are not limited thereto. The first substrate SUB may include active regions defined by a device isolation layer DIL.

The lower level layer PS may include the peripheral transistors PTR, which are disposed on the active regions of the first substrate SUB. As described above, the peripheral transistors PTR may constitute or correspond to the row and column decoders and/or drivers, the page buffer, the control circuit, the peripheral logic circuit, and/or the like.

The lower level layer PS may include a peripheral circuit region including a decoder circuit, a page buffer, and a logic circuit. The lower level layer PS may further include lower interconnection lines LIL, which are provided on the peripheral transistors PTR, and a first interlayer insulating layer ILD1, which is provided to cover the peripheral transistors PTR and the lower interconnection lines LIL. A peripheral contact PCNT may be provided between the lower interconnection line LIL and the peripheral transistor PTR to electrically connect them to each other. The first interlayer insulating layer ILD1 may have a multi-layered structure including a plurality of stacked insulating layers. For example, the first interlayer insulating layer ILD1 may include a silicon oxide layer, a silicon nitride layer, a silicon oxynitride layer, and/or a low-k dielectric layer. The upper level layer CS may be provided on the first interlayer insulating layer ILD1 of the lower level layer PS. The upper level layer CS will be described in more detail below.

The upper level layer CS may include a cell array region CAR, a cell contact region CNR, and a peripheral region PER. The cell contact region CNR may be located between the cell array region CAR and the peripheral region PER. In some example embodiments, the peripheral region PER may be an outer edge region of a semiconductor chip.

A second substrate SL may be provided on the first interlayer insulating layer ILD1. The second substrate SL may support the cell array structure ST provided on the cell array region CAR. The second substrate SL of the cell array region CAR may include a lower semiconductor layer LSL, a source semiconductor layer SSL, and an upper semiconductor layer USL, which are sequentially stacked. Each of the lower semiconductor layer LSL, the source semiconductor layer SSL, and the upper semiconductor layer USL may be formed of or include at least one of semiconductor materials (e.g., silicon (Si), germanium (Ge), silicon germanium (SiGe), gallium arsenic (GaAs), indium gallium arsenic (InGaAs), aluminum gallium arsenic (AlGaAs), or mixtures thereof). Each of the lower semiconductor layer LSL, the source semiconductor layer SSL, and the upper semiconductor layer USL may have a single crystalline, amorphous, and/or polycrystalline structure. As an example, each of the lower semiconductor layer LSL, the source semiconductor layer SSL, and the upper semiconductor layer USL may include an n-type poly-silicon layer doped with impurities such as at least one of phosphorus or arsenic. The lower semiconductor layer LSL, the source semiconductor layer SSL, and the upper semiconductor layer USL may have doping concentrations that are different from each other.

The source semiconductor layer SSL may be interposed between the lower semiconductor layer LSL and the upper semiconductor layer USL. The lower semiconductor layer LSL and the upper semiconductor layer USL may be electrically connected to each other by the source semiconductor layer SSL.

The second substrate SL of the cell contact region CNR may include the lower semiconductor layer LSL, a fifth insulating layer IL5, a lower sacrificial layer LHL, a sixth insulating layer IL6, and the upper semiconductor layer USL, which are sequentially stacked. The fifth and sixth insulating layers IL5 and IL6 may include a silicon oxide layer, and the lower sacrificial layer LHL may include a silicon nitride layer or a silicon oxynitride layer.

The lower semiconductor layer LSL of the second substrate SL may be extended from the cell array region CAR to the peripheral region PER. The lower semiconductor layer LSL may be extended to a portion of the peripheral region PER but may not be extended to another portion of the peripheral region PER. For example, in some example embodiments the peripheral region PER may include a portion, in which the lower semiconductor layer LSL is not provided.

The cell array structure ST may be provided on the cell array region CAR and the cell contact region CNR of the second substrate SL. The cell array structure ST may include a first stack ST1 and a second stack ST2 on the first stack ST1. A second interlayer insulating layer ILD2 and a third interlayer insulating layer ILD3 may be provided on the second substrate SL. A top surface of the second interlayer insulating layer ILD2 may be coplanar with a top surface of the first stack ST1. A top surface of the third interlayer insulating layer ILD3 may be coplanar with a top surface of the second stack ST2. The second and third interlayer insulating layers ILD2 and ILD3 may cover a staircase structure STS of the cell array structure ST.

The first stack ST1 may include first electrodes ELL which are stacked in a direction (e.g., a third direction D3) perpendicular to the second substrate SL. The first stack ST1 may further include first insulating layers IL1 separating the stacked first electrodes EL1 from each other. The first insulating layers IL1 and the first electrodes EL1 may be alternately stacked in the first stack ST1. A second insulating layer IL2 may be provided as the uppermost layer of the first stack ST1. The second insulating layer IL2 may be thicker than each of the first insulating layers IL1; however, example embodiments are not limited thereto.

The second stack ST2 may include second electrodes EL2, which are stacked on the first stack ST1 in the third direction D3. The second stack ST2 may further include third insulating layers IL3, which separate the stacked second electrodes EL2 from each other. The third insulating layers IL3 and the second electrodes EL2 of the second stack ST2 may be alternately stacked. A fourth insulating layer IL4 may be provided as the uppermost layer of the second stack ST2. The fourth insulating layer IL4 may be thicker than each of the third insulating layers IL3; however, example embodiments are not limited thereto. A number of first electrodes EL1 may be the same as, or greater than, or less than, a number of second electrodes EL2. A thickness of the first electrodes EL1 may be the same as, or greater than, or less than, a thickness of the second electrodes EL2.

The cell array structure ST may include the staircase structure STS on the cell contact region CNR. The staircase structure STS may be a portion of the cell array structure ST, which is extended from the cell array region CAR to the cell contact region CNR in a second direction D2. For example, the first and second electrodes EL1 and EL2 of the cell array structure ST may constitute or be included in the staircase structure STS that is extended from the cell array region CAR to the cell contact region CNR. The staircase structure STS on the cell contact region CNR may be connected to the cell array structure ST on the cell array region CAR. A height of the staircase structure STS may decrease with decreasing distance to the peripheral region PER. For example, the height of the staircase structure STS may decrease with decreasing distance to the second direction D2.

The lowermost one of the first electrodes EL1 of the cell array structure ST may serve as or correspond to the first lower selection line LL1 (e.g., see FIG. 1), and the next lowermost one of the first electrodes EL1 on the lowermost first electrode EL1 may serve as or correspond to the second lower selection line LL2 (e.g., see FIG. 1).

The uppermost one of the second electrodes EL2 of the cell array structure ST may serve as or correspond to the first string selection line UL1 (e.g., see FIG. 1), and the next uppermost one of the second electrodes EL2 below the uppermost second electrode EL2 may serve as or correspond to the second string selection line UL2 (e.g., see FIG. 1).

The remaining ones of the first and second electrodes EL1 and EL2, except for the first and second lower selection lines and the first and second string selection lines, may serve as or correspond to the word lines WL (e.g., see FIG. 1).

The first and second electrodes EL1 and EL2 may include end portions that are provided to constitute or be included in the staircase structure STS. For example, the end portions of the first and second electrodes EL1 and EL2 may be sequentially stacked and may have horizontal lengths different from each other in the second direction D2.

The first and second electrodes EL1 and EL2 may be formed of or include at least one conductive material selected from the group consisting of doped semiconductor materials (e.g., doped silicon), metallic materials (e.g., tungsten, copper, and/or aluminum), conductive metal nitrides (e.g., titanium nitride and/or tantalum nitride), and transition metals (e.g., titanium and/or tantalum). At least one of first to fourth insulating layers IL1 to IL4 may include a silicon oxide layer.

A plurality of vertical channel structures VS may be provided on the cell array region CAR to penetrate the cell array structure ST. Each of the vertical channel structures VS may include a vertical insulating pattern VP, a vertical semiconductor pattern SP, and an insulating gapfill pattern VI. The vertical semiconductor pattern SP may be interposed between the vertical insulating pattern VP and the insulating gapfill pattern VI. A conductive pad PAD may be provided in an upper portion of each of the vertical channel structures VS.

The insulating gapfill pattern VI may have a circular pillar shape. The vertical semiconductor pattern SP may be extended from the lower semiconductor layer LSL to the conductive pad PAD in the third direction D3 to cover a surface of the insulating gapfill pattern VI. The vertical semiconductor pattern SP may be shaped like a pipe such as a smoking pipe with an open top end. The vertical insulating pattern VP may cover an outer surface of the vertical semiconductor pattern SP and may be extended from the lower semiconductor layer LSL to a top surface of a fourth interlayer insulating layer ILD4 in the third direction D3. The vertical insulating pattern VP may be shaped like a pipe such as a smoking pipe with an open top end. The vertical insulating pattern VP may be interposed between the cell array structure ST and the vertical semiconductor pattern SP.

Referring to FIG. 7, the vertical insulating pattern VP may include one or more layers. In some example embodiments, the vertical insulating pattern VP may include a data storing layer. In some example embodiments, the vertical insulating pattern VP may include a tunnel insulating layer TNL, a charge storing layer CTL, and a blocking insulating layer BKL constituting a data storing layer of a NAND FLASH memory device.

For example, the charge storing layer CTL may be a trap insulating layer, a floating gate electrode, and/or an insulating layer including conductive nanodots. The charge storing layer CTL may include at least one of a silicon nitride layer, a silicon oxynitride layer, a silicon-rich nitride layer, a nanocrystalline silicon layer, and a laminated trap layer. The tunnel insulating layer TNL may be formed of or include a material whose band gap larger is larger than the charge storing layer. The tunnel insulating layer TNL may include a high-k dielectric layer (e.g., an aluminum oxide layer and/or a hafnium oxide layer) and/or a silicon oxide layer. The blocking insulating layer BKL may include a silicon oxide layer.

The vertical semiconductor pattern SP may be formed of or include at least one of semiconductor materials (e.g., silicon (Si), germanium (Ge), or mixtures thereof). Alternatively or additionally, the vertical semiconductor pattern SP may be formed of or include at least one of doped semiconductor materials or undoped (i.e., intrinsic) semiconductor materials. The vertical semiconductor pattern SP including the semiconductor material may be used as channel regions of transistors constituting a memory cell string.

The conductive pad PAD may cover a top surface of the vertical semiconductor pattern SP and a top surface of the insulating gapfill pattern VI. The conductive pad PAD may be formed of or include at least one of doped semiconductor materials or conductive materials. A bit line contact BPLG may be electrically connected to, e.g. directly connected to, the vertical semiconductor pattern SP through the conductive pad PAD.

The source semiconductor layer SSL may be in contact with/direct contact with a lower sidewall of each of the vertical semiconductor patterns SP. The source semiconductor layer SSL may electrically connect the vertical semiconductor patterns SP to each other. For example, all of the vertical semiconductor patterns SP may be electrically connected to the second substrate SL. The second substrate SL may serve as source regions of memory cells. A common source voltage may be applied to the second substrate SL through a source contact plug SPLG, which will be described below.

Each of the vertical channel structures VS may include a first vertical extended portion VEP1 penetrating the first stack ST1, a second vertical extended portion VEP2 penetrating the second stack ST2, and an expanded portion EXP between the first and second vertical extended portions VEP1 and VEP2. The expanded portion EXP may be provided in/within the second insulating layer IL2.

The first vertical extended portion VEP1 may have a diameter increasing in an upward direction. The second vertical extended portion VEP2 may also have a diameter increasing in the upward direction. A diameter of the expanded portion EXP may be greater than the largest diameter of the first vertical extended portion VEP1 and may be greater than the largest diameter of the second vertical extended portion VEP2.

A plurality of separation structures SPS may be provided to penetrate the cell array structure ST (e.g., see FIG. 6B). The cell array structure ST may be horizontally divided into a plurality of structures by the separation structures SPS. For example, each electrode EL1 or EL2 in the cell array structure ST may be horizontally divided into a plurality of electrodes by the separation structures SPS. The separation structures SPS may be formed of or include at least one of insulating materials (e.g., silicon oxide).

The fourth interlayer insulating layer ILD4 may be provided on the cell array structure ST and the third interlayer insulating layer ILD3. A fifth interlayer insulating layer ILD5 may be provided on the fourth interlayer insulating layer ILD4.

Bit line contacts BPLG may be provided to penetrate the fifth interlayer insulating layer ILD5 and at least one bit line contact BPLG may be coupled to/connected to/directly connected to the conductive pads PAD, respectively. The bit lines BL may be disposed on the fifth interlayer insulating layer ILD5. The bit lines BL may be extended in a first direction D1 to be parallel to each other. The bit lines BL may be electrically connected to the vertical channel structures VS, respectively, through the bit line contacts BPLG.

A plurality of first upper interconnection lines UIL1 may be provided on the fifth interlayer insulating layer ILD5 of the cell contact region CNR. Cell contact plugs CPLG may be provided to vertically extend from the first upper interconnection lines UIL1 to the staircase structure STS.

The cell contact plugs CPLG may be respectively coupled to exposed portions of the first and second electrodes EL1 and EL2 of the staircase structure STS. The cell contact plugs CPLG may be sequentially coupled to end portions of the first and second electrodes EL1 and EL2, respectively. The first and second electrodes EL1 and EL2 may be electrically connected to the first upper interconnection lines UIL1, respectively, through the cell contact plugs CPLG.

A second upper interconnection line UIL2 may be provided on the fifth interlayer insulating layer ILD5 of the peripheral region PER. The source contact plug SPLG may be provided to vertically extend from the second upper interconnection line UIL2 to the lower semiconductor layer LSL. The second upper interconnection line UIL2 may be electrically connected to the second substrate SL through the source contact plug SPLG. A common source voltage may be applied to the second substrate SL through the second upper interconnection line UIL2 and the source contact plug SPLG.

A third upper interconnection line UIL3 may be provided on the fifth interlayer insulating layer ILD5 of the peripheral region PER. A through via TVS may be provided to vertically extend from the third upper interconnection line UIL3 to the lower interconnection line LIL of the lower level layer PS. The upper level layer CS may be electrically connected to the lower level layer PS through the through via TVS.

Referring back to FIGS. 5 and 6B, a cutting structure SSC may be provided on the cell array region CAR. The cutting structure SSC may be extended in the second direction D2 to cross an upper portion of the cell array structure ST. The cutting structure SSC may have a line/linear/bar shape, when viewed in a plan view.

The vertical channel structures VS may be two-dimensionally arranged to form a number of rows, for example first to eighth rows RO1-RO8. The first to eighth rows RO1-RO8 may be arranged in the first direction D1 to be spaced apart from each other by a constant distance. The vertical channel structures VS in each of the first to eighth rows RO1-RO8 may be arranged in the second direction D2 to be spaced apart from each other with the same pitch.

The vertical channel structures VS in adjacent rows may be offset from each other in the second direction D2. For example, the vertical channel structures VS of the first row RO1 may be offset from the vertical channel structures VS of the second row RO2 in the second direction D2.

The cutting structure SSC may be provided between the fourth row RO4 and the fifth row RO5 and may be extended in the second direction D2. The cutting structure SSC may be vertically overlapped with at least a portion of each of the vertical channel structures VS of the fourth and fifth rows RO4 and RO5. For example, the cutting structure SSC may be extended to cross the vertical channel structures VS of the fourth and fifth rows RO4 and RO5.

Referring to FIG. 7, the cutting structure SSC may be provided to penetrate at least the uppermost one of the second electrodes EL2 (hereinafter, corresponding to a first string selection line SSL1) and one of the second electrodes EL2 below the first string selection line SSL1 (hereinafter, corresponding to a second string selection line SSL2). The first string selection line SSL1 may be divided into two lines by the cutting structure SSC. The second string selection line SSL2 may be divided into two lines by the cutting structure SSC.

The cutting structure SSC may be extended from a top surface of the fourth interlayer insulating layer ILD4 to the third insulating layer IL3 below the second string selection line SSL2. A top surface of the cutting structure SSC may be coplanar/substantially coplanar with a top surface TS of the conductive pad PAD. A bottom surface SSCb of the cutting structure SSC may be located at a level between the second string selection line SSL2 and the second electrode EL2 (e.g., the word line WL) below the second string selection line SSL2.

The cutting structure SSC may be provided to penetrate at least a portion of the conductive pad PAD. The cutting structure SSC may also be provided to at least partially penetrate an upper portion of the vertical channel structure VS. The vertical semiconductor pattern SP adjacent to the cutting structure SSC may be in contact with/direct contact with the bottom surface SSCb of the cutting structure SSC. The vertical insulating pattern VP adjacent to the cutting structure SSC may be in contact with/direct contact with the bottom surface SSCb of the cutting structure SSC.

The bit line contact BPLG may be provided on the conductive pad PAD and the cutting structure SSC. The bit line contact BPLG may be coupled to a remaining portion of the conductive pad PAD.

A bottom surface BS of the bit line contact BPLG may be lower than/slightly lower than the top surface TS of the conductive pad PAD. The bottom surface BS of the bit line contact BPLG may include a first bottom surface BS1 in contact with/directly contacting the conductive pad PAD and a second bottom surface BS2 in contact with/directly contacting the cutting structure SSC. In some example embodiments, the first bottom surface BS1 and the second bottom surface BS2 may be coplanar with each other, but in some example embodiments, the first bottom surface BS1 and the second bottom surface BS2 may be positioned at different levels.

Since the first bottom surface BS1 of the bit line contact BPLG is in contact with/in direct contact with the conductive pad PAD, the vertical channel structure VS, which is partially overlapped with the cutting structure SSC, may be normally used as a channel region. The vertical semiconductor pattern SP of the vertical channel structure VS, which is partially overlapped with the cutting structure SSC, may be electrically connected to the bit line BL through the conductive pad PAD and also the bit line contact BPLG.

The cutting structure SSC may include a first cutting layer SSC1 and a second cutting layer SSC2, which are provided in a recess RS penetrating the first and second string selection lines SSL1 and SSL2. The first cutting layer SSC1 may be formed to conformally cover/surround/blanket an inner surface of the recess RS. The first cutting layer SSC1 may serve as a liner protecting the second cutting layer SSC2.

The second cutting layer SSC2 may be provided on the first cutting layer SSC1 to fill the recess RS. The second cutting layer SSC2 may be in contact with/in direct contact with the second bottom surface BS2 of the bit line contact BPLG. The second cutting layer SSC2 may serve as a stopper preventing or reducing the likelihood of and/or the amount of and/or the impact of the bit line contact BPLG from being extended into the cutting structure SSC.

The second cutting layer SSC2 may be formed of or include an insulating material having an etch selectivity with respect to the first cutting layer SSC1, e.g. having a difference in wet and/or dry etch rates with respect to the first cutting layer SSC1. For example, the first cutting layer SSC1 may be formed of or include silicon oxide, and the second cutting layer SSC2 may be formed of or include at least one of SiN, SiON, SiOC, SiOCN, or undoped polysilicon.

According to some example embodiments of inventive concepts, even when the cutting structure SSC is provided to partially penetrate the vertical channel structures VS of the fourth and fifth rows RO4 and RO5, the vertical channel structures VS of the fourth and fifth rows RO4 and RO5 may be nonetheless used as channel regions of a memory cell string. Since the cutting structure SSC is disposed between the fourth and fifth rows RO4 and RO5, an additional area for the cutting structure SSC may be unnecessary, and thus, it may be possible to increase an integration density of the memory cell strings.

Figure 8:
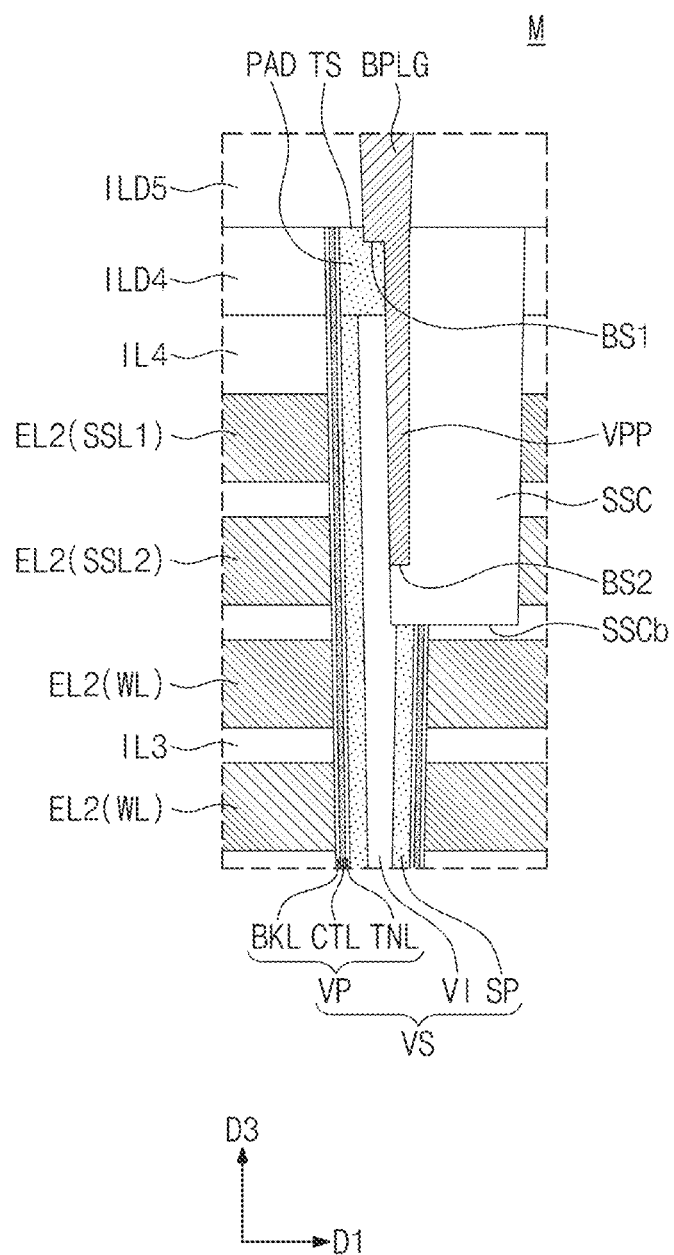
FIG. 8 is a sectional view illustrating a portion of a semiconductor device (e.g., a portion 'M' of FIG. 6B) according to a comparative example.

FIG. 8 is a sectional view illustrating a portion of a semiconductor device (e.g., a portion 'M' of FIG. 6B) according to a comparative example. Referring to FIG. 8, the cutting structure SSC according to the comparative example may be formed of a single insulating material. For example, the cutting structure SSC may include a silicon oxide layer.

The bit line contact BPLG may include a vertical protruding portion VPP, which is vertically extended along the cutting structure SSC. The vertical protruding portion VPP may be downward extended along an inner side surface of the recess RS. Accordingly, the second bottom surface BS2 of the bit line contact BPLG may be located at a level that is much lower than the first bottom surface BS1. There may not be efficient control of, e.g. efficient fabrication and/or etch control of, the location of the second bottom surface BS2.

In a case where the cutting structure SSC includes only a single insulating layer, the cutting structure SSC may be easily etched by an etching process for forming the bit line contact BPLG, and in this case, the vertical protruding portion VPP may be formed to have the afore-described structure. The vertical protruding portion VPP may result in a punch-through failure which causes in deterioration in electric characteristics of a memory cell or in reliability of the semiconductor device.

By contrast, according to some example embodiments for example as shown in FIG. 7, the cutting structure SSC may include the first and second cutting layers SSC1 and SSC2, which are formed of different materials from each other, and may not be a single insulating layer. In this case, the second cutting layer SSC2 may be used to prevent or reduce the likelihood of and/or the impact from the bit line contact BPLG from having the afore-described vertical protruding portion VPP. Alternatively or additionally, the first cutting layer SSC1 may be used to protect or partially protect the second cutting layer SSC2 during the fabrication process. As a result, according to some example embodiments of inventive concepts, it may be possible to prevent or reduce the likelihood of and/or the impact of a process failure from occurring in the bit line contact BPLG and to improve the reliability of the semiconductor device.

FIGS. 9A, 10A, 11A, 12A, 13A, 14A, 15A, and 16A are sectional views, which are taken along the line I-I' of FIG. 5 to illustrate a method of fabricating a semiconductor device according to some example embodiments of inventive concepts. FIGS. 9B, 10B, 11B, 12B, 13B, 14B, 15B, and 16B are sectional views, which are taken along the line II-II' of FIG. 5 to illustrate a method of fabricating a semiconductor device according to some example embodiments of inventive concepts.

Figure 9B:
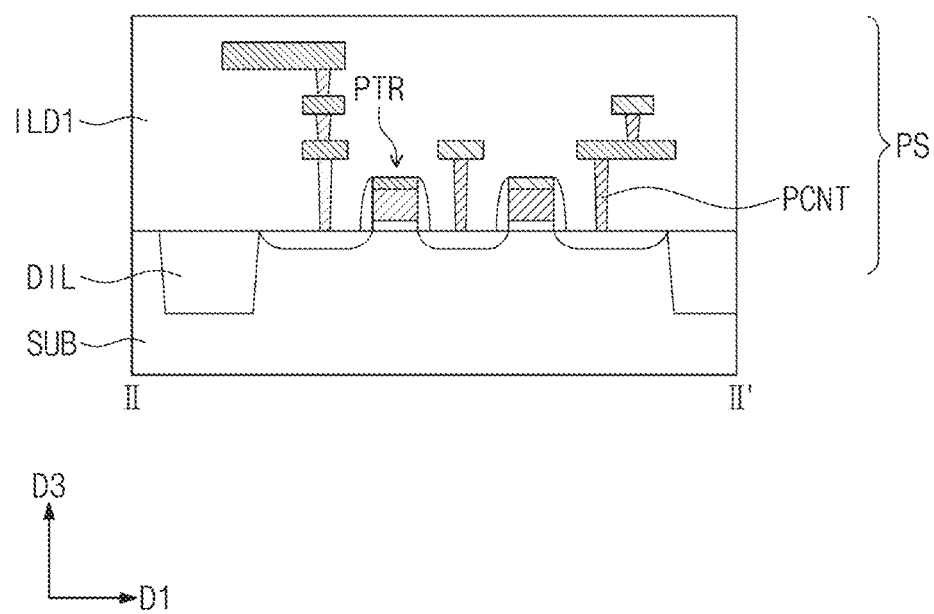
FIGS. 9B, 10B, 11B, 12B, 13B, 14B, 15B, and 16B are sectional views, which are taken along the line II-II' of FIG. 5 to illustrate a method of fabricating a semiconductor device according to some example embodiments of inventive concepts.

Referring to FIGS. 5, 9A, and 9B, the lower level layer PS may be formed on the first substrate SUB. The formation of the lower level layer PS may include forming the peripheral transistors PTR on the first substrate SUB and forming the lower interconnection lines LIL on the peripheral transistors PTR. For example, the formation of the peripheral transistors PTR may include forming the device isolation layer DIL on the first substrate SUB to define active regions, forming a gate insulating layer and a gate electrode on the active regions, and injecting impurities into the active regions to form a source/drain region. The first interlayer insulating layer ILD1 may be formed to cover the peripheral transistors PTR and the lower interconnection lines LIL. A number of peripheral transistors PTR and/or lower interconnection lines LIL are not limited thereto. Furthermore although the peripheral transistors PTR are illustrated as being planar transistors, example embodiments are not limited thereto.

Figure 10A:
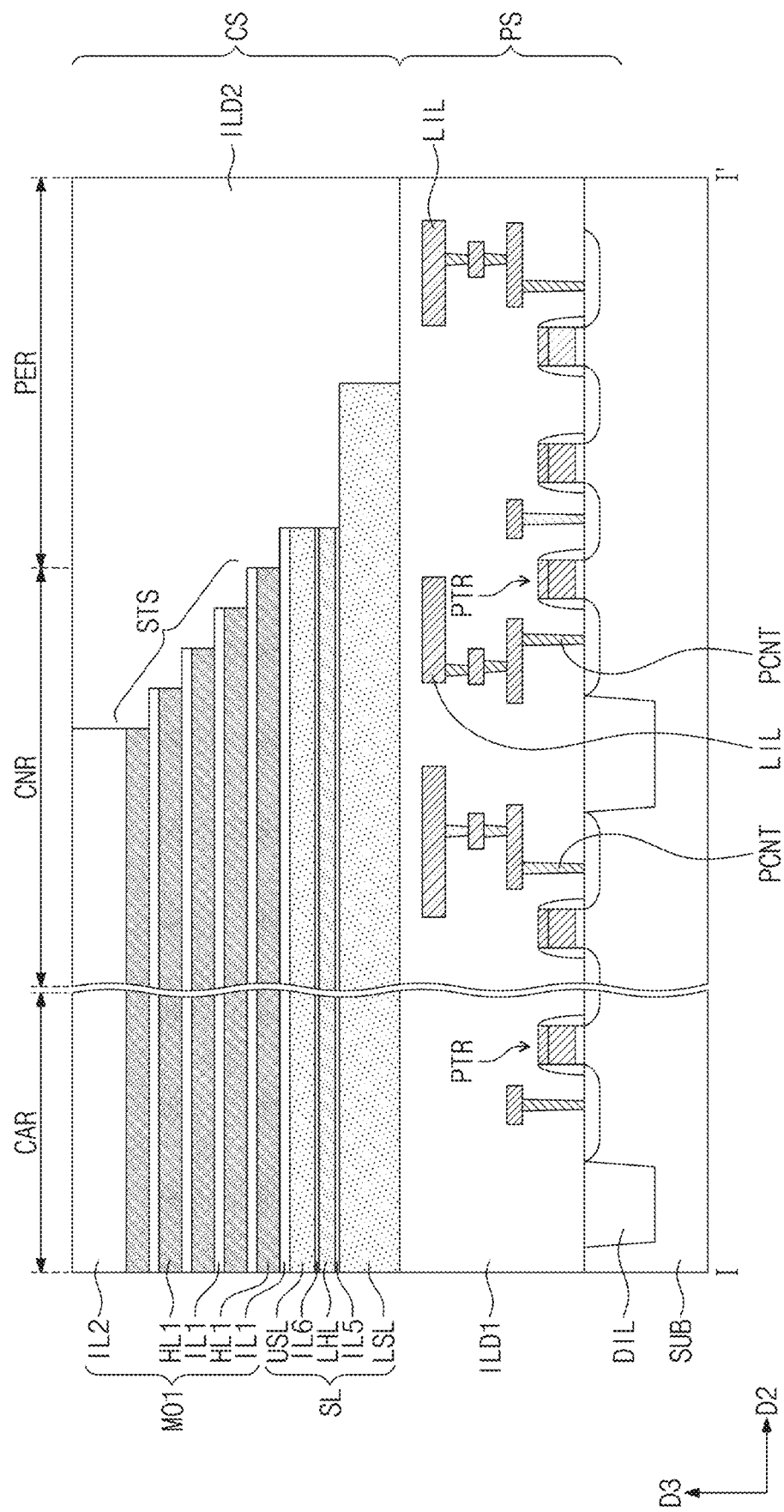
Figure 10B:
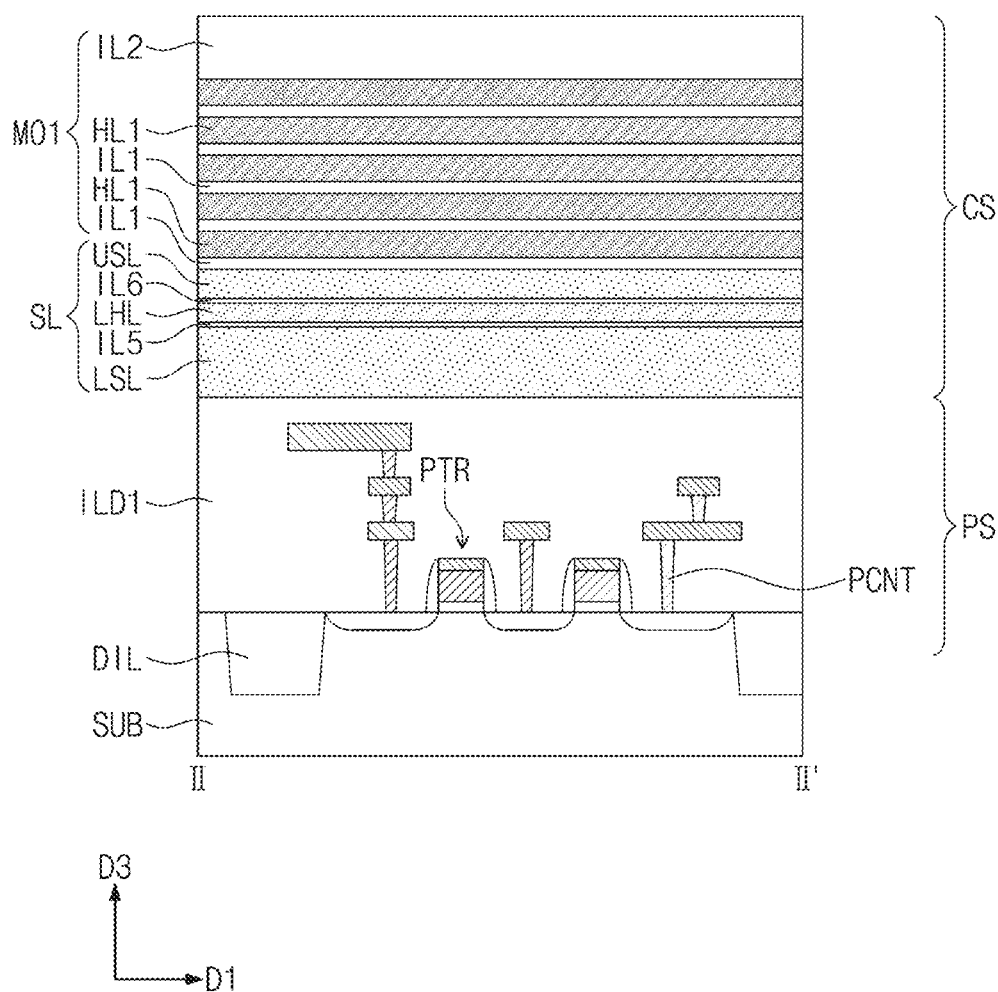

Referring to FIGS. 5, 10A, and 10B, the upper level layer CS including the cell array region CAR, the cell contact region CNR, and the peripheral region PER may be formed on the first interlayer insulating layer ILD1. In detail, the second substrate SL may be formed on the first interlayer insulating layer ILD1. The formation of the second substrate SL may include sequentially forming the lower semiconductor layer LSL, the fifth insulating layer IL5, the lower sacrificial layer LHL, the sixth insulating layer IL6, and the upper semiconductor layer USL. For example, the lower semiconductor layer LSL and the upper semiconductor layer USL may be formed of or include a semiconductor material (e.g., polysilicon). The fifth and sixth insulating layers IL5 and IL6 may be formed of or include silicon oxide, and the lower sacrificial layer LHL may be formed of or include silicon nitride or silicon oxynitride.

A first mold structure MO1 may be formed on the second substrate SL. In detail, the first mold structure MO1 may be formed by alternately depositing the first insulating layers IL1 and first sacrificial layers HL1 on the upper semiconductor layer USL. The second insulating layer IL2 may be formed as the uppermost layer of the first mold structure MO1.

The first insulating layers IL1, the first sacrificial layers HL1, and the second insulating layer IL2 may be deposited using at least one of a thermal chemical vapor deposition (thermal CVD) process, a plasma-enhanced chemical vapor deposition (Plasma enhanced CVD) process, a physical chemical vapor deposition (physical CVD) process, or an atomic layer deposition (ALD) process. The first insulating layers IL1 and the second insulating layer IL2 may be formed of or include silicon oxide, and the first sacrificial layers HL1 may be formed of or include silicon nitride or silicon oxynitride.

The staircase structure STS may be formed in the first mold structure MO1 on the cell contact region CNR. In detail, a cycle process may be performed on the first mold structure MO1 to form the staircase structure STS on the cell contact region CNR. The formation of the staircase structure STS may include forming a mask pattern (not shown) on the first mold structure MO1 and performing a cyclic patterning process using the mask pattern several times. The cyclic patterning process may include a step of etching a portion of the first mold structure MO1 using the mask pattern as an etch mask and a trimming step of reducing a size of the mask pattern.

The second interlayer insulating layer ILD2 may be formed on the first mold structure MO1. The formation of the second interlayer insulating layer ILD2 may include forming an insulating layer to cover the first mold structure MO1 and performing a planarization process on the insulating layer to expose the second insulating layer IL2.

Figure 11A:
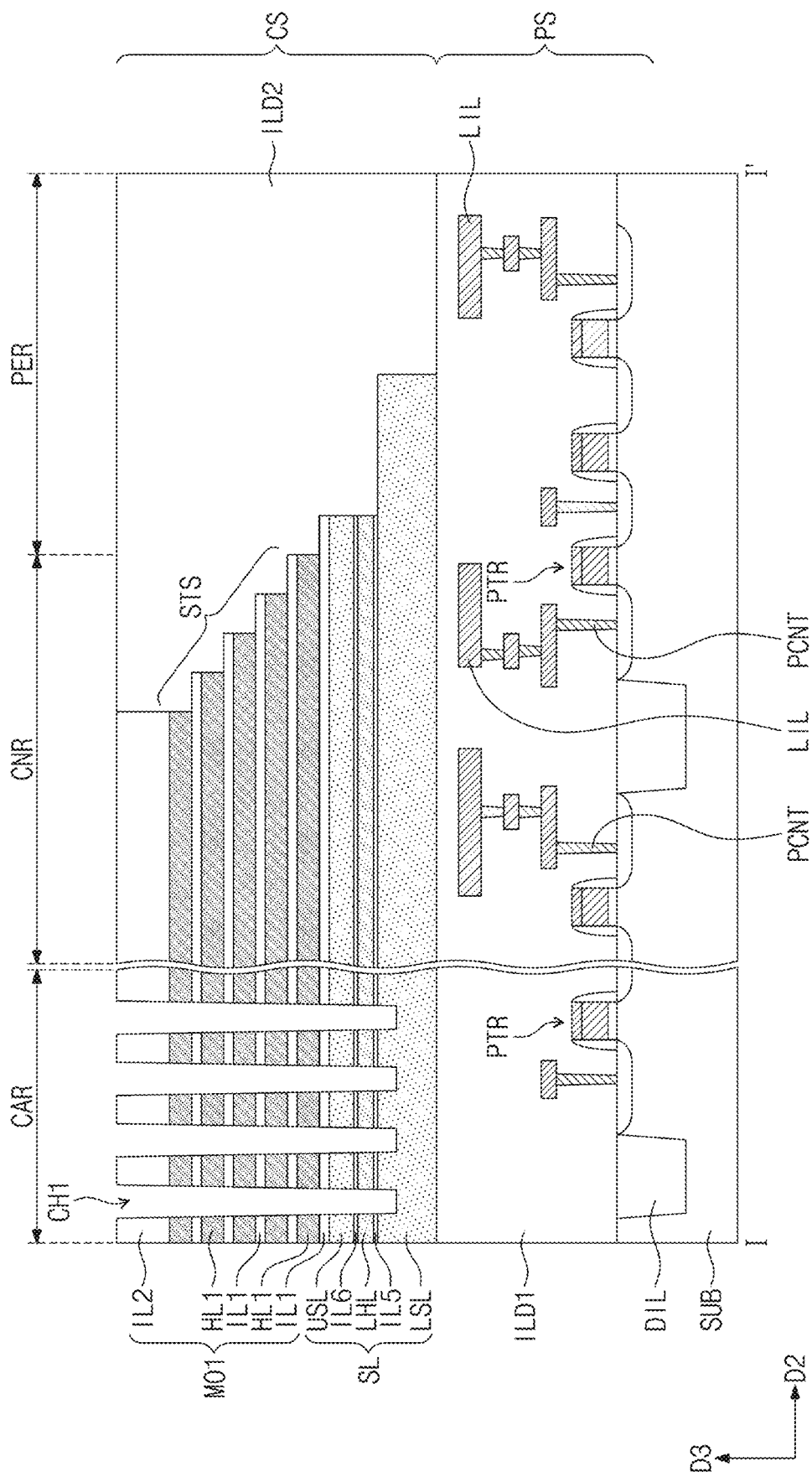
Figure 11B:
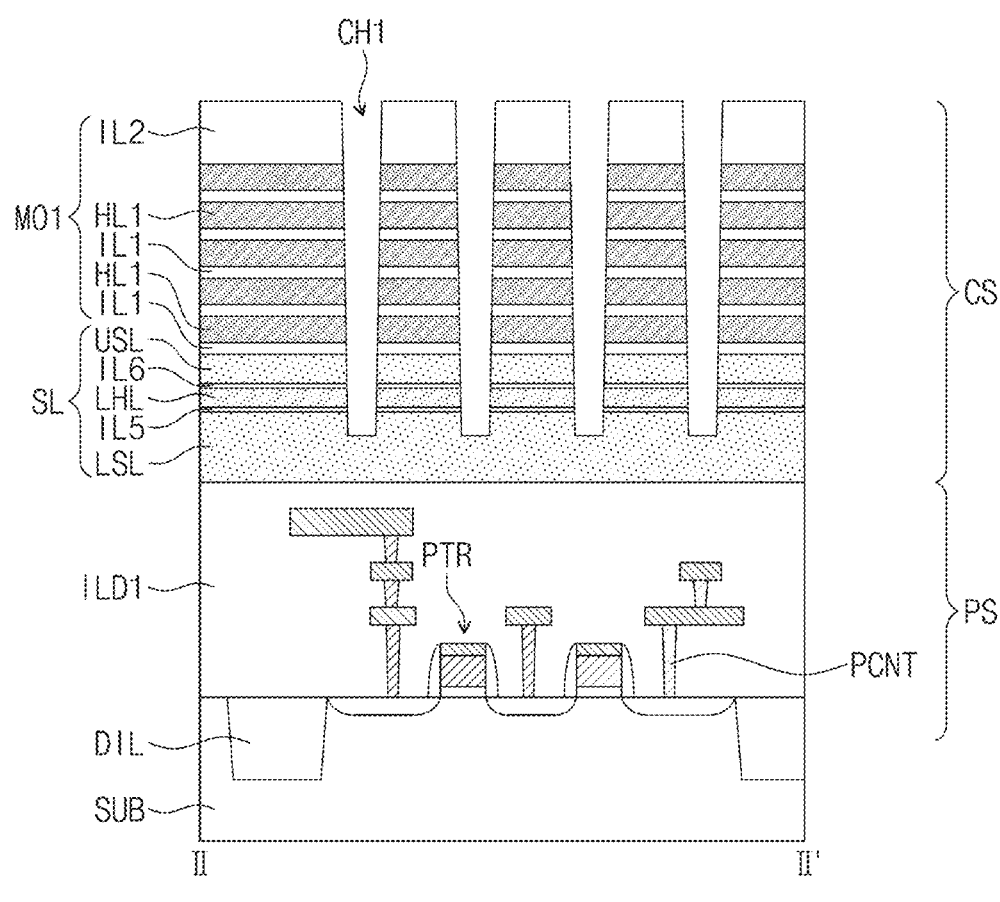

Referring to FIGS. 5, 11A, and 11B, first channel holes CH1 may be formed on the cell array region CAR to penetrate the first mold structure MO1. Each of the first channel holes CH1 may be formed to expose the lower semiconductor layer LSL.

In detail, the formation of the first channel holes CH1 may include forming a mask pattern (not shown), in which openings defining regions for the first channel holes CH1 are provided, on the first mold structure MO1 and anisotropically etching the first mold structure MO1 using the mask pattern as an etch mask. The anisotropic etching process may include a plasma etching process, a reactive ion etching (RIE) process, inductively-coupled plasma reactive ion etching (ICP-RIE) process, or an ion beam etching (IBE) process.

According to some example embodiments of inventive concepts, a patterning process for forming the first channel holes CH1 may include a lithography process using extreme ultraviolet (EUV) light. In some example embodiments, the EUV light may have a wavelength ranging from 4 nm and 124 nm and, in particular, from 4 nm and 20 nm and may be, for example, an ultraviolet light having a wavelength of 13.5 nm. The EUV light may have an energy of 6.21 eV to 124 eV (in particular, 90 eV to 95 eV).

The EUV lithography process may include a step of exposing a photoresist layer to extreme ultraviolet (EUV) light and a step of developing the exposed photoresist layer. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but inventive concepts is not limited to these examples.

Mask patterns may be formed by patterning one or more mask layers, which are disposed below the photoresist patterns, using the photoresist patterns as an etch mask. Desired patterns may be formed on a wafer by patterning a target layer using the mask patterns as an etch mask.

In a comparative example of inventive concepts, a multi-patterning technology (MPT) using two or more photomasks is required to form fine-pitch patterns on the wafer. By contrast, in the case where the EUV lithography process according to some example embodiments of inventive concepts is performed, it may be possible to form the first channel holes CH1 with a fine pitch by using only one photomask.

For example, in the case where the first channel holes CH1 are formed by the EUV lithography process according to the present embodiment, the minimum pitch between the first channel holes CH1 may be less than 45 nm. For example, by using the EUV lithography process, it may be possible to more precisely and finely form the first channel holes CH1, without a multi-patterning technology.

Figure 12A:
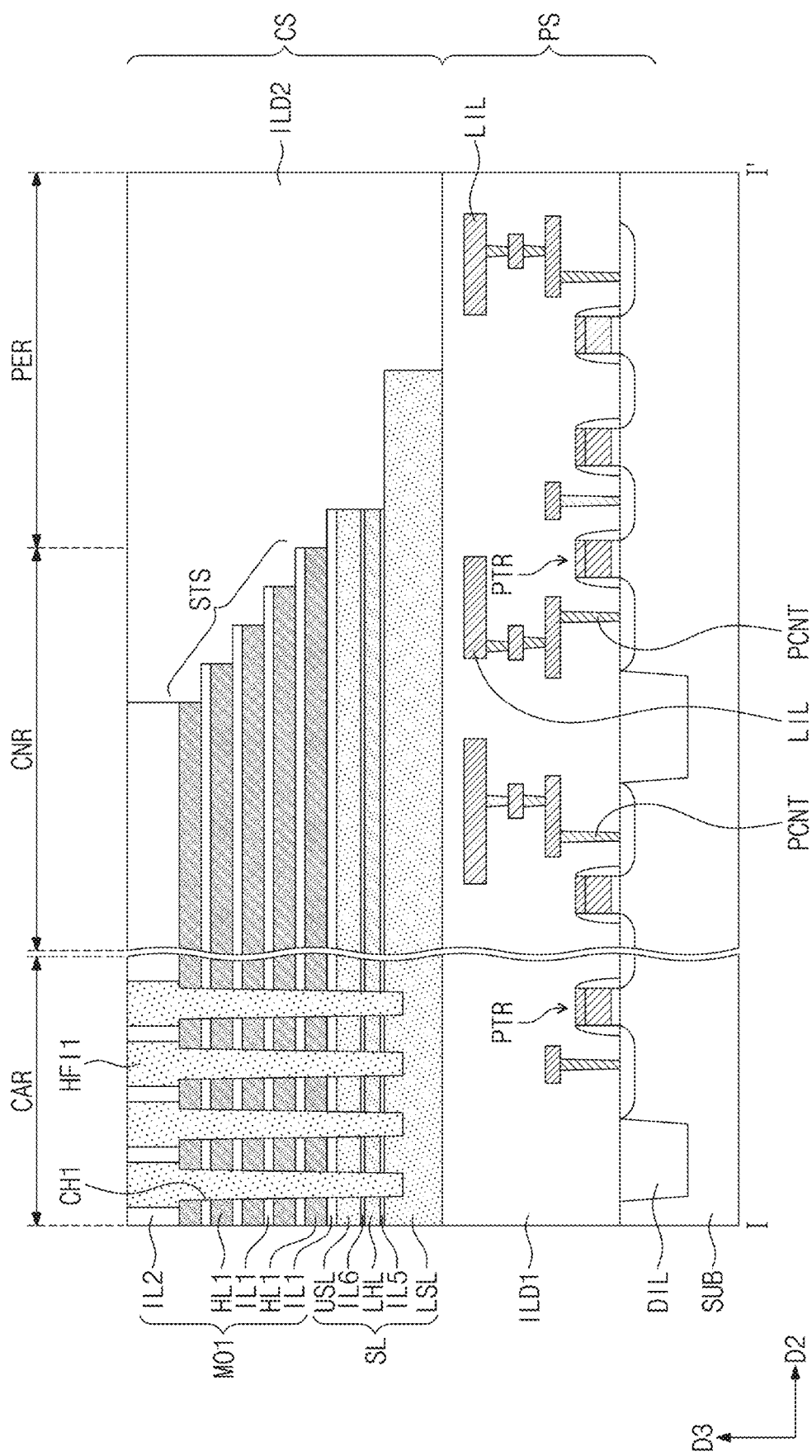
Figure 12B:
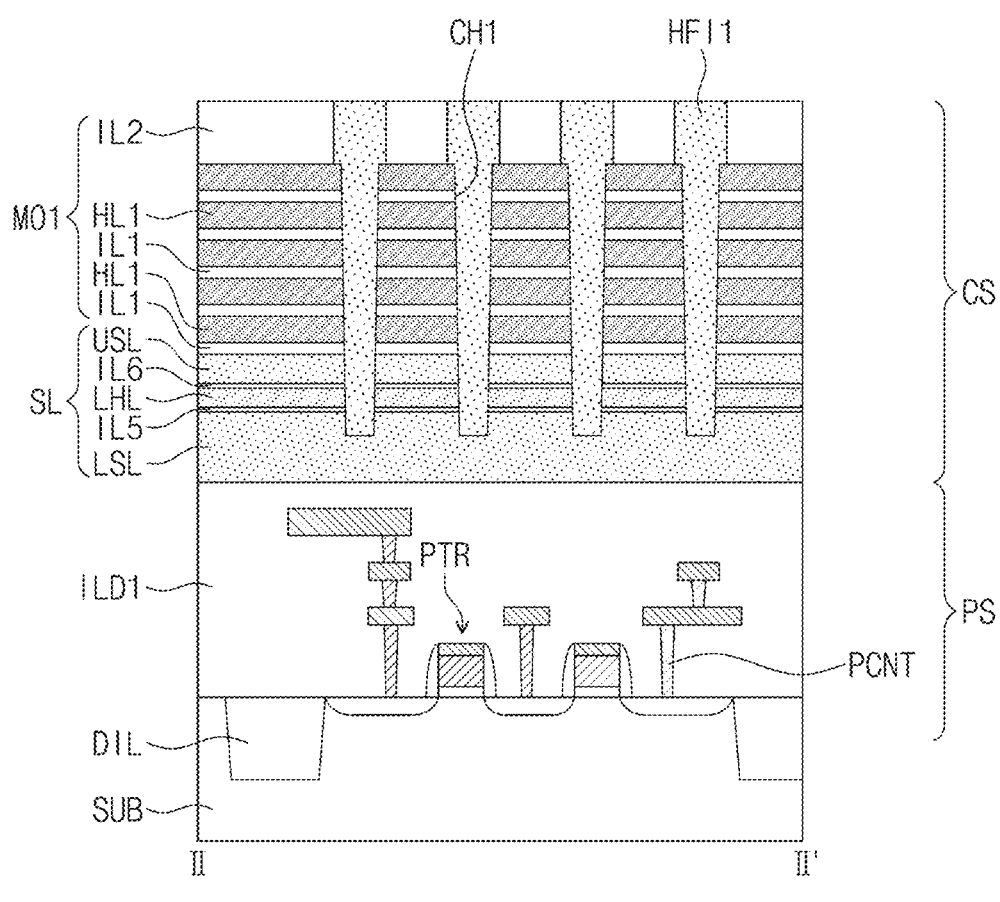

Referring to FIGS. 5, 12A, and 12B, an upper portion of each of the first channel holes CH1 may be expanded. Accordingly, a diameter of the first channel hole CH1 in the second insulating layer IL2 may be abruptly increased.

First sacrificial pillars HFI1 may be formed to fill the first channel holes CH1, respectively. In detail, the formation of the first sacrificial pillars HFI1 may include forming a first sacrificial mask layer to fill the first channel holes CH1 and planarizing the first sacrificial mask layer to expose a top surface of the second insulating layer IL2. For example, the first sacrificial mask layer may be formed of or include polysilicon.

Figure 13A:
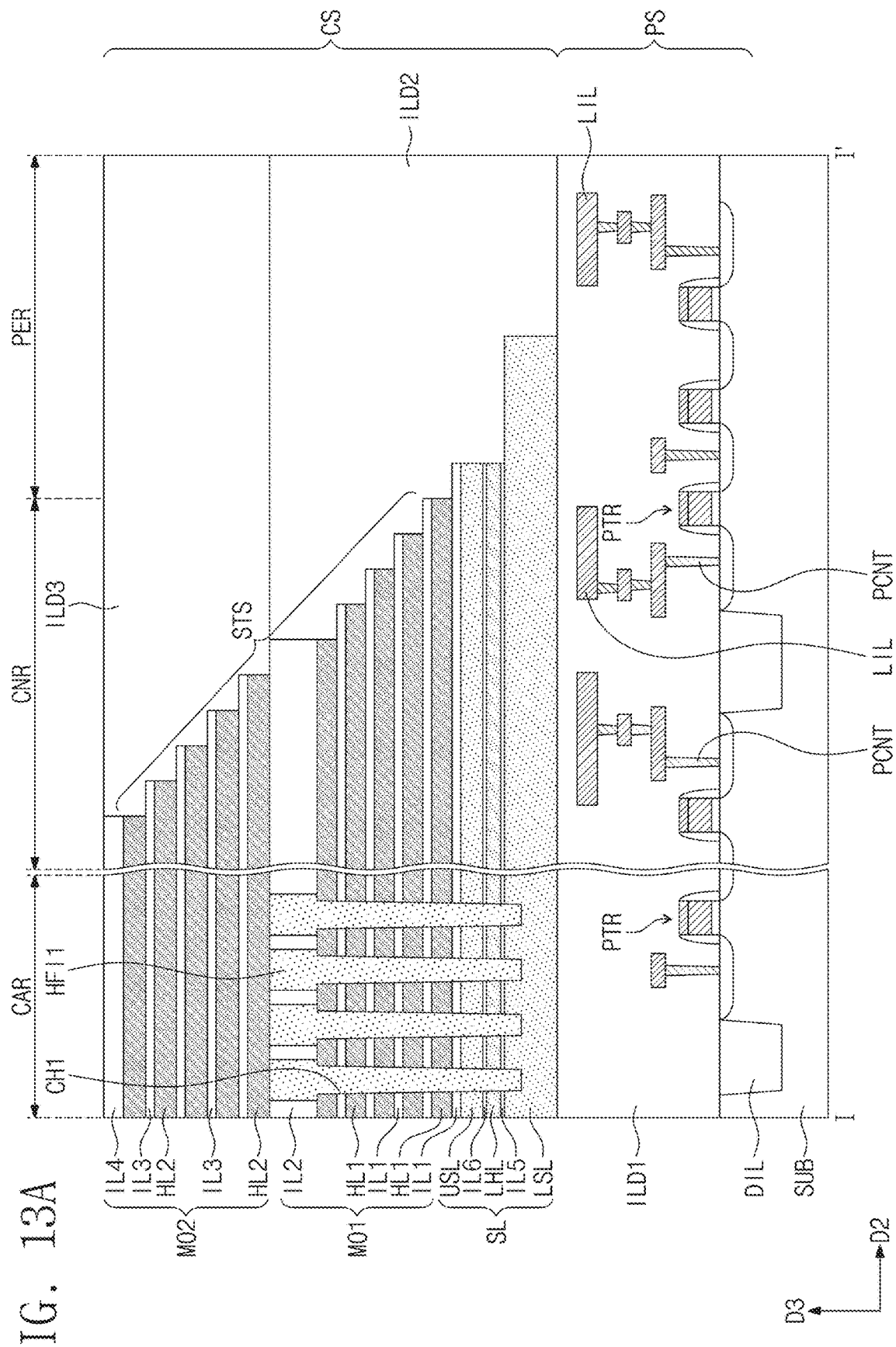
Figure 13B:
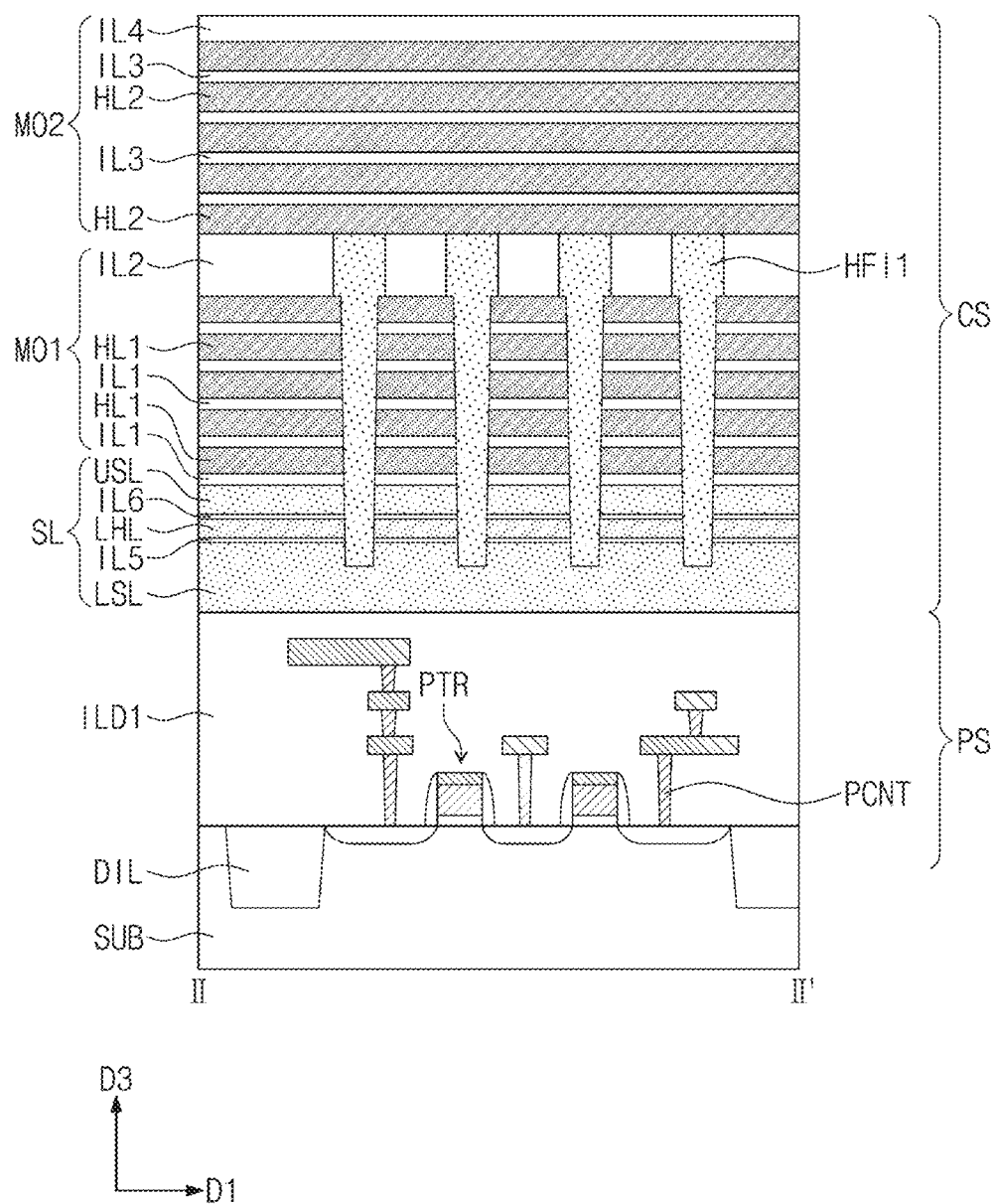

Referring to FIGS. 5, 13A, and 13B, a second mold structure MO2 may be formed on the first mold structure MO1 of the cell array region CAR. The formation of the second mold structure MO2 may include alternately stacking the third insulating layers IL3 and second sacrificial layers HL2 on the first mold structure MO1 to form a stack and performing a cyclic process on the stack, which is composed of the third insulating layers IL3 and the second sacrificial layers HL2, to form the staircase structure STS. The cyclic process may be performed in the same manner as the process for forming the staircase structure STS of the first mold structure MO1.

The second mold structure MO2 may have the staircase structure STS. The staircase structure STS of the second mold structure MO2 may be connected to the staircase structure STS of the first mold structure MO1.

The fourth insulating layer IL4 may be formed as the uppermost layer of the second mold structure MO2. The third insulating layers IL3 and the fourth insulating layer IL4 may include a silicon oxide layer, and the second sacrificial layers HL2 may include a silicon nitride layer or a silicon oxynitride layer. The second sacrificial layers HL2 may be formed of or include the same material as the first sacrificial layers HL1.

The third interlayer insulating layer ILD3 may be formed on the second mold structure MO2. The formation of the third interlayer insulating layer ILD3 may include forming an insulating layer to cover the second mold structure MO2 and performing a planarization process on the insulating layer to expose the fourth insulating layer IL4. The third interlayer insulating layer ILD3 may cover the staircase structure STS of the second mold structure MO2.

Figure 14A:
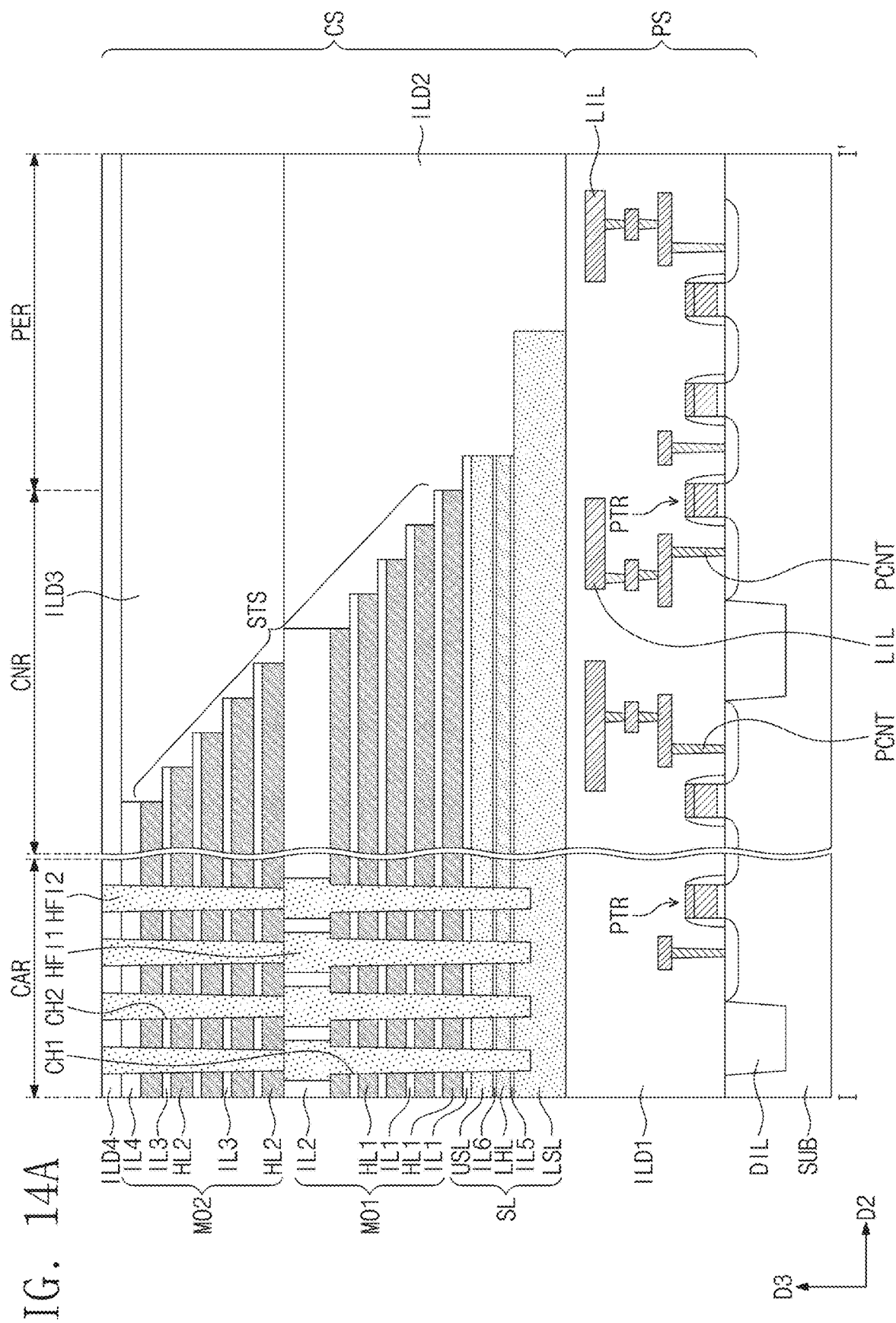
Figure 14B:
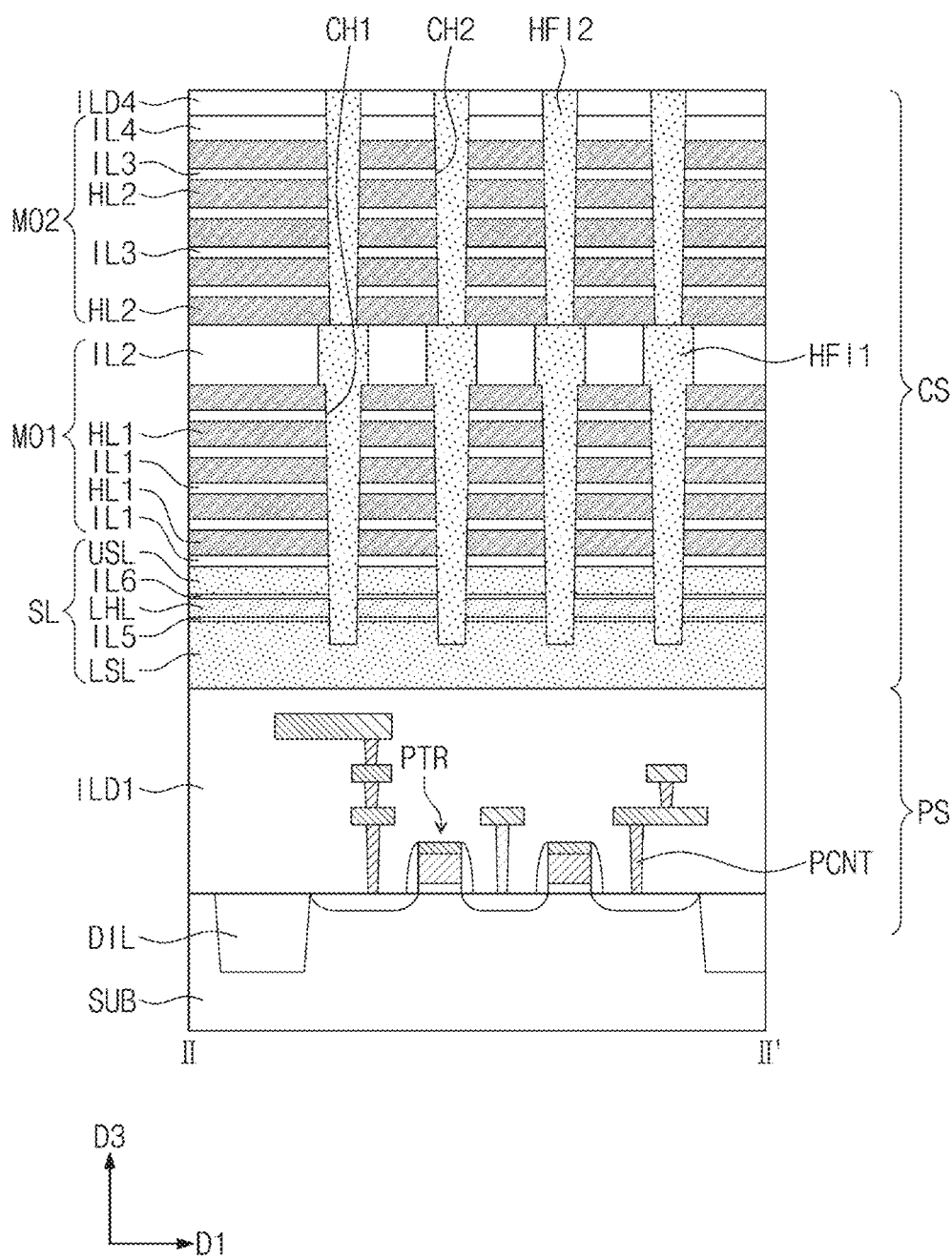

Referring now to FIGS. 5, 14A, and 14B, the fourth interlayer insulating layer ILD4 may be formed on a top surface of the first substrate SUB. Second channel holes CH2 may be formed to penetrate the second mold structure MO2 of the cell array region CAR. The second channel holes CH2 may be formed to be vertically overlapped with the first sacrificial pillars HFI1, respectively.

The second channel holes CH2 may be formed using a photolithography process. In detail, the formation of the second channel holes CH2 may include forming a photoresist pattern (and a mask pattern thereunder), in which openings defining regions for the second channel holes CH2 are defined, using a photolithography process, and performing an anisotropic etching process using the photoresist pattern as an etch mask. Except for this, a process of forming the second channel holes CH2 may be performed in substantially the same manner as that for forming the first channel holes CH1.

Second sacrificial pillars HFI2 may be formed to fill the second channel holes CH2, respectively. The second sacrificial pillars HFI2 may be vertically overlapped with the first sacrificial pillars HFI1, respectively. In detail, the formation of the second sacrificial pillars HFI2 may include forming a second sacrificial mask layer to fill the second channel holes CH2 and planarizing the second sacrificial mask layer to expose the top surface of the fourth interlayer insulating layer ILD4. For example, the second sacrificial mask layer may be formed of or include polysilicon. The second sacrificial pillars HFI2 may be formed of or include the same material as the first sacrificial pillars HFI1.

Figure 15A:
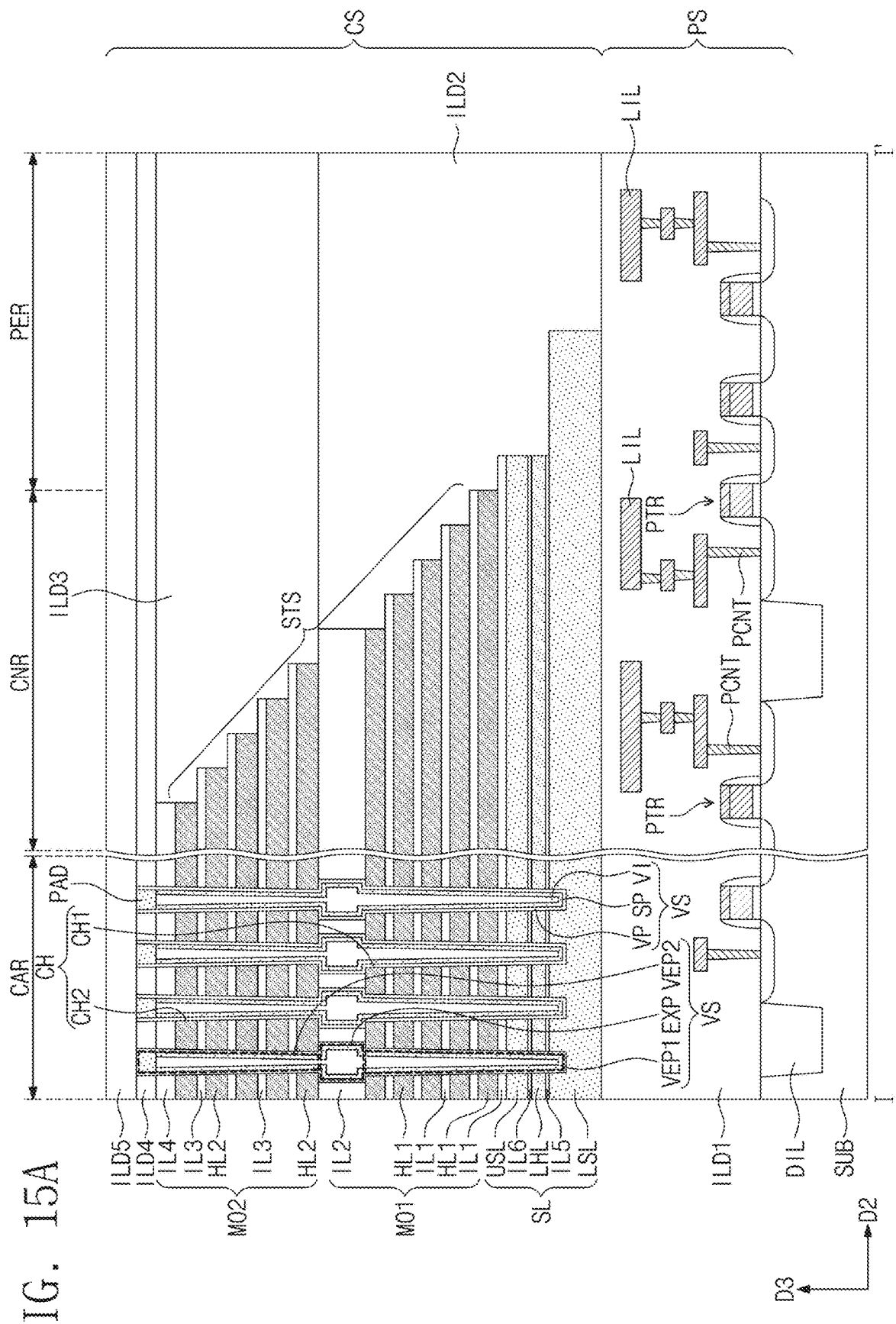
Figure 15B:
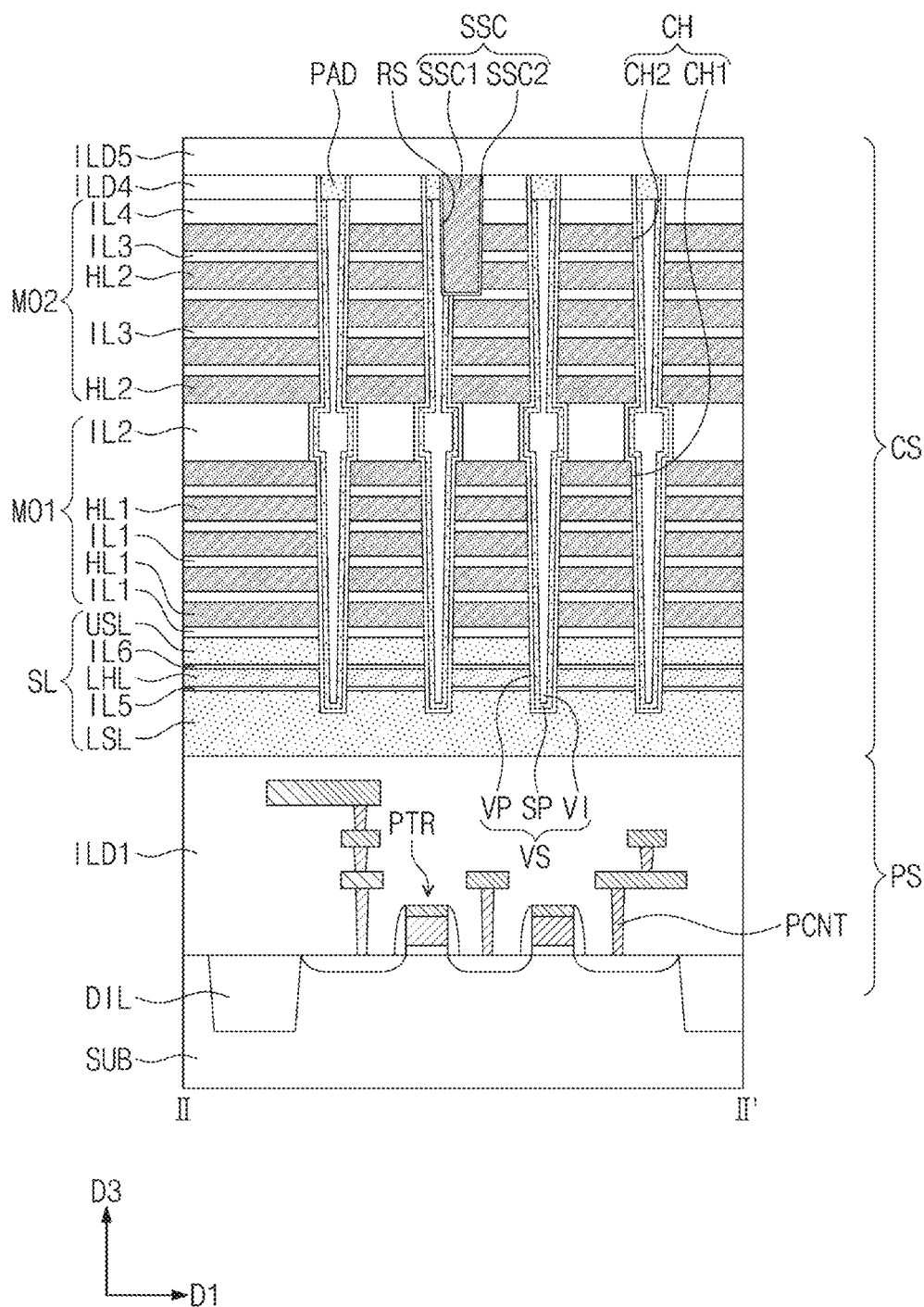

Referring to FIGS. 5, 15A, and 15B, the first and second sacrificial pillars HFI1 and HFI2 may be selectively removed from the first and second channel holes CH1 and CH2. The first and second channel holes CH1 and CH2, from which the first and second sacrificial pillars HFI1 and HFI2 are removed, may be connected to each other to form a single channel hole CH.

The vertical channel structures VS may be formed in/within the channel holes CH, respectively. The formation of the vertical channel structure VS may include sequentially forming the vertical insulating pattern VP, the vertical semiconductor pattern SP, and the insulating gapfill pattern VI on an inner surface of the channel hole CH. The vertical insulating pattern VP and the vertical semiconductor pattern SP may be conformally formed. The conductive pad PAD may be formed in an upper portion of each of the vertical channel structures VS.

The recess RS defining the cutting structure SSC may be formed in an upper portion of the second mold structure MO2. The recess RS may be formed to penetrate two uppermost ones of the second sacrificial layers HL2 of the second mold structure MO2. Additionally, the recess RS may be formed to partially penetrate an upper portion of the vertical channel structure VS.

The cutting structure SSC may be formed by sequentially forming the first cutting layer SSC1 and the second cutting layer SSC2 in/inside the recess RS. In detail, the formation of the cutting structure SSC may include forming the first cutting layer SSC1 to conformally cover/blanket an inner surface of the recess RS, forming the second cutting layer SSC2 on the first cutting layer SSC1 to fill, e.g. fully fill, the recess RS, and performing a planarization process on the first and second cutting layers SSC1 and SSC2 to expose the conductive pad PAD by using, for example, a chemical mechanical planarization (CMP) process and/or an etchback process.

The first and second cutting layers SSC1 and SSC2 may be formed using insulating materials that are different from each other. For example, the first cutting layer SSC1 may be formed of or include silicon oxide and not including, e.g., any of, SiN, SiON, SiOC, SiOCN, or undoped polysilicon, and the second cutting layer SSC2 may be formed of or include at least one of materials (e.g., SiN, SiON, SiOC, SiOCN, or undoped polysilicon) having an etch selectivity with respect to the first cutting layer SSC1 and not including silicon oxide.

The fifth interlayer insulating layer ILD5 may be formed on the fourth interlayer insulating layer ILD4 to cover the conductive pads PAD and the cutting structure SSC.

Figure 16B:
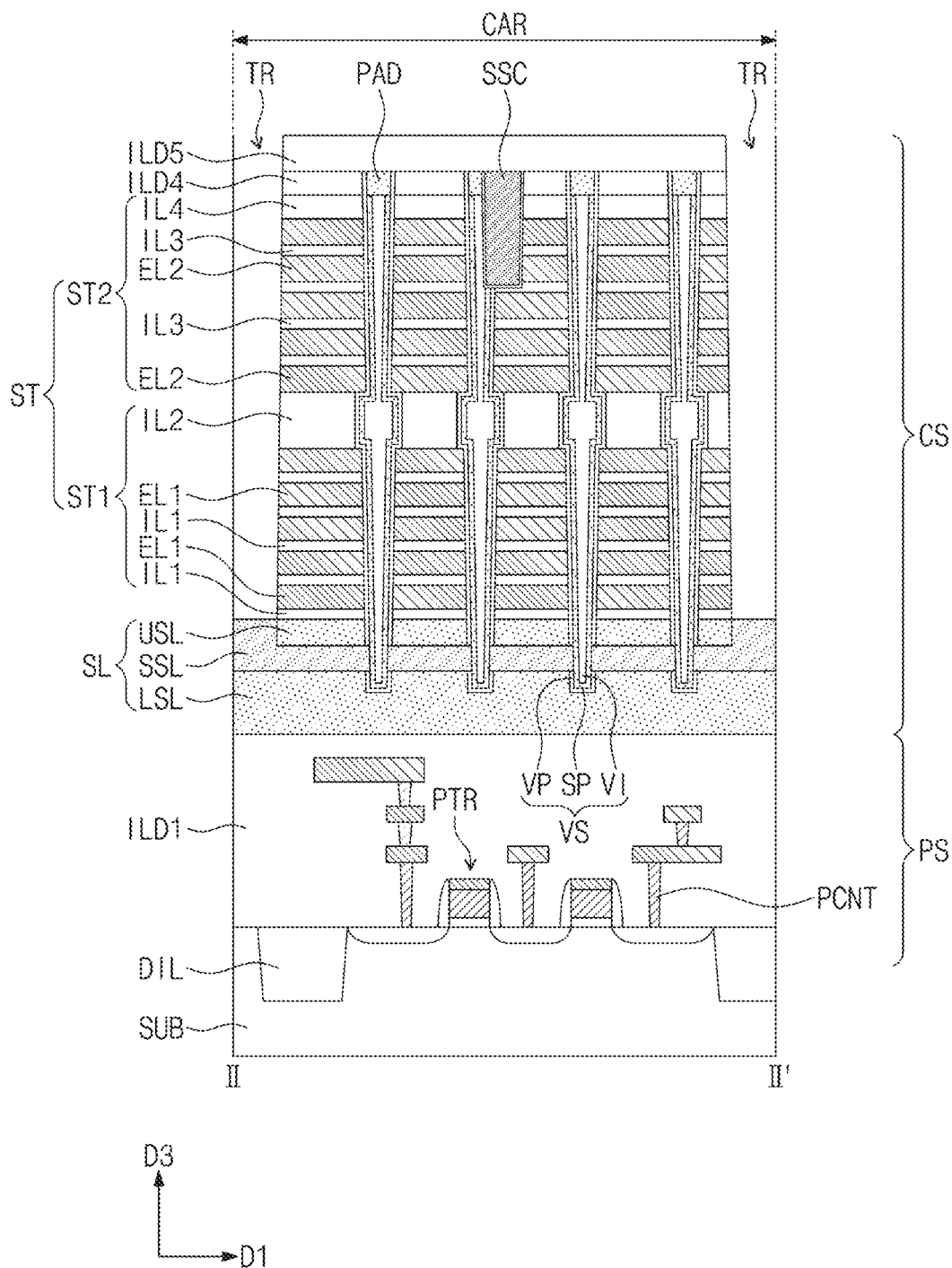

Referring to FIGS. 5, 16A, and 16B, the first and second mold structures MO1 and MO2 on the cell array region CAR may be patterned to form trenches TR penetrating them. The trenches TR may be formed to define the separation structures SPS.

The trench TR may be formed to expose the lower semiconductor layer LSL. The trench TR may be formed to expose side surfaces of the first and second sacrificial layers HL1 and HL2. The trench TR may expose the side surface of the fifth insulating layer IL5, the side surface of the lower sacrificial layer LHL, and the side surface of the sixth insulating layer IL6.

In the cell array region CAR, the lower sacrificial layer LHL exposed by the trenches TR may be replaced with the source semiconductor layer SSL. In detail, the lower sacrificial layer LHL exposed by the trenches TR may be selectively removed. As a result of the removal of the lower sacrificial layer LHL, a lower portion of the vertical insulating pattern VP of each of the vertical channel structures VS may be exposed.

The exposed lower portion of the vertical insulating pattern VP may be selectively removed. Accordingly, a lower portion of the vertical semiconductor pattern SP may be exposed. The fifth insulating layer IL5 and the sixth insulating layer IL6 may be removed during removing the lower portion of the vertical insulating pattern VP.

The source semiconductor layer SSL may be formed in a space, from which the fifth insulating layer IL5, the lower sacrificial layer LHL, and the sixth insulating layer IL6 are removed. The source semiconductor layer SSL may be in direct contact with the exposed lower portion of the vertical semiconductor pattern SP. The source semiconductor layer SSL may be in direct contact with the lower semiconductor layer LSL below the source semiconductor layer SSL. The source semiconductor layer SSL may be in direct contact with the upper semiconductor layer USL thereon. The lower semiconductor layer LSL, the source semiconductor layer SSL, and the upper semiconductor layer USL in the cell array region CAR may constitute the second substrate SL.

In the cell array region CAR, the first and second sacrificial layers HL1 and HL2 exposed by the trenches TR may be replaced with the first and second electrodes EL1 and EL2 to form the cell array structure ST. In detail, the first and second sacrificial layers HL1 and HL2 exposed through the trenches TR may be selectively removed. The first and second electrodes EL1 and EL2 may be formed in empty spaces, respectively, which are formed by the removing of the first and second sacrificial layers HL1 and HL2.

During the removing of the first and second sacrificial layers HL1 and HL2, the first cutting layer SSC1 of the cutting structure SSC may prevent or reduce the likelihood of and/or impact of the second cutting layer SSC2 from being etching. Accordingly, the second cutting layer SSC2 may be left as it is.

Referring back to FIGS. 5, 6A, and 6B, the separation structures SPS may be formed to fill the trenches TR, respectively. The cell contact plugs CPLG may be formed to be connected to the staircase structure STS of the cell array structure ST. The source contact plug SPLG may be formed to be connected to the lower semiconductor layer LSL. The through via TVS may be formed to be connected to the lower interconnection line LIL of the lower level layer PS.

The bit line contacts BPLG may be formed to penetrate the fifth interlayer insulating layer ILD5 and may be coupled to the conductive pads PAD, respectively. At least one of the bit line contacts BPLG may be formed to be coupled to the conductive pad PAD that is in contact with the cutting structure SSC. In a process of forming the bit line contact BPLG, the second cutting layer SSC2 of the cutting structure SSC may serve as a stopper preventing or reducing the likelihood of and/or impact of the vertical protruding portion VPP of FIG. 8 from being formed.

The bit lines BL, which are respectively connected to the bit line contacts BPLG, may be formed on the fifth interlayer insulating layer ILD5. The first upper interconnection lines UIL1, which are respectively connected to the cell contact plugs CPLG, may be formed on the fifth interlayer insulating layer ILD5. The second upper interconnection line UIL2 and the third upper interconnection line UIL3, which are respectively connected to the source contact plug SPLG and the through via TVS, may be formed on the fifth interlayer insulating layer ILD5.

FIGS. 17 to 20 are enlarged sectional views, each of which illustrates a portion of a semiconductor device (e.g., a portion 'M' of FIG. 6B), according to some example embodiments of inventive concepts. In the following description of the present embodiment, an element previously described with reference to FIGS. 5, 6A, 6B, and 7 may be identified by a similar or identical reference number without repeating an overlapping description thereof.

Figure 17:
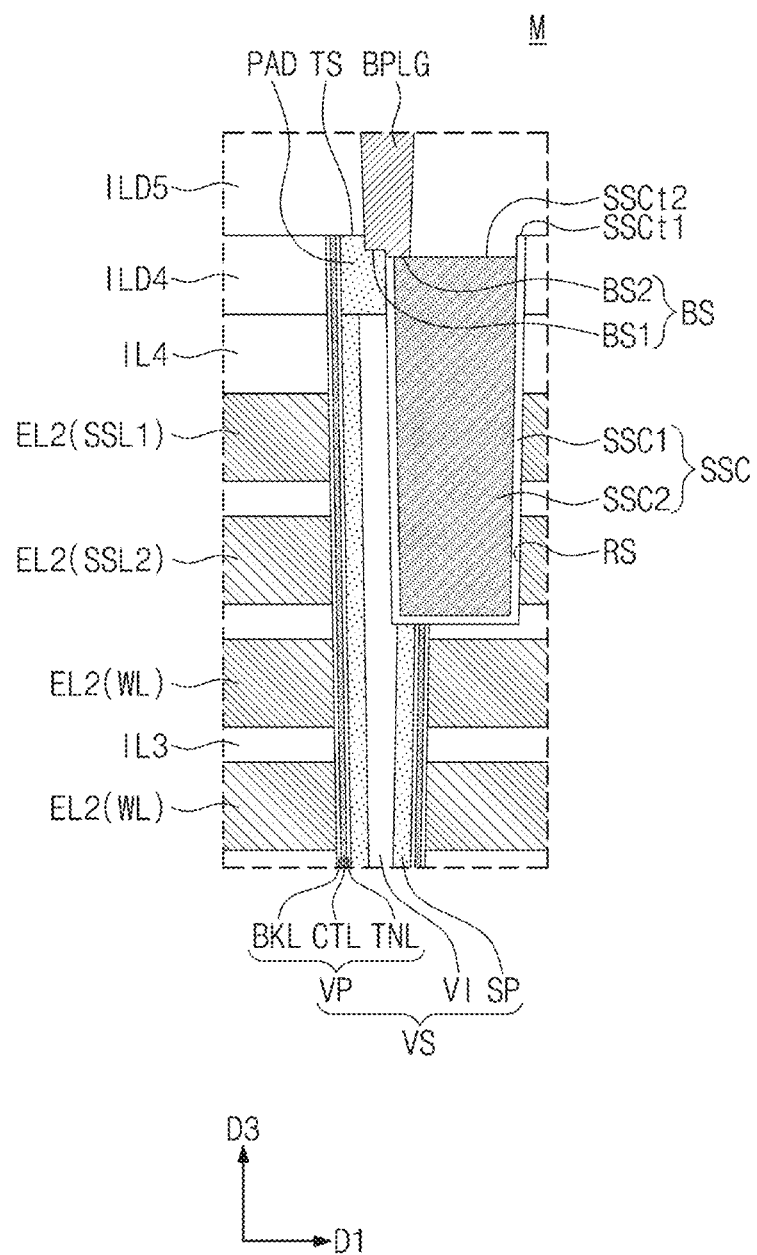
FIGS. 17 to 20 are enlarged sectional views, each of which illustrates a portion of a semiconductor device (e.g., a portion 'M' of FIG. 6B), according to some example embodiments of inventive concepts.

Referring to FIG. 17, a top surface SSCt1 of the first cutting layer SSC1 may be higher than a top surface SSCt2 of the second cutting layer SSC2. In other words, an upper portion of the second cutting layer SSC2 may be recessed, and in some example embodiments, the top surface SSCt2 of the second cutting layer SSC2 may be lower than the top surface TS of the conductive pad PAD. The first bottom surface BS1 of the bit line contact BPLG may be higher than the second bottom surface BS2. The second bottom surface BS2 of the bit line contact BPLG may be in contact with the top surface SSCt2 of the second cutting layer SSC2.

Figure 18:
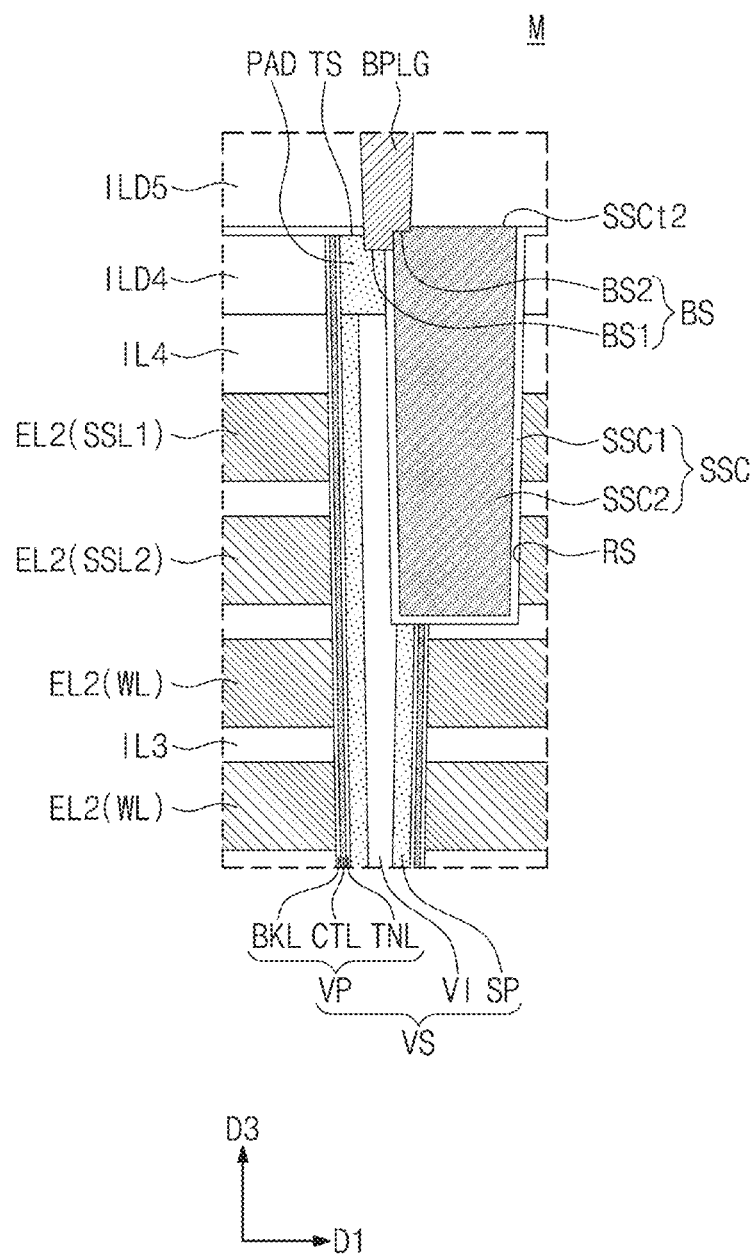

Referring to FIG. 18, the first cutting layer SSC1 may be extended to a region on the top surface of the fourth interlayer insulating layer ILD4. Accordingly, the first cutting layer SSC1 may be interposed between the fourth interlayer insulating layer ILD4 and the fifth interlayer insulating layer ILD5. Since the first cutting layer SSC1 is extended to the region on the top surface of the fourth interlayer insulating layer ILD4, the top surface SSCt2 of the second cutting layer SSC2 may be higher than the top surface TS of the conductive pad PAD. The first bottom surface BS1 of the bit line contact BPLG may be lower than the second bottom surface BS2. The second bottom surface BS2 of the bit line contact BPLG may be in contact with the top surface SSCt2 of the second cutting layer SSC2.

Figure 19:
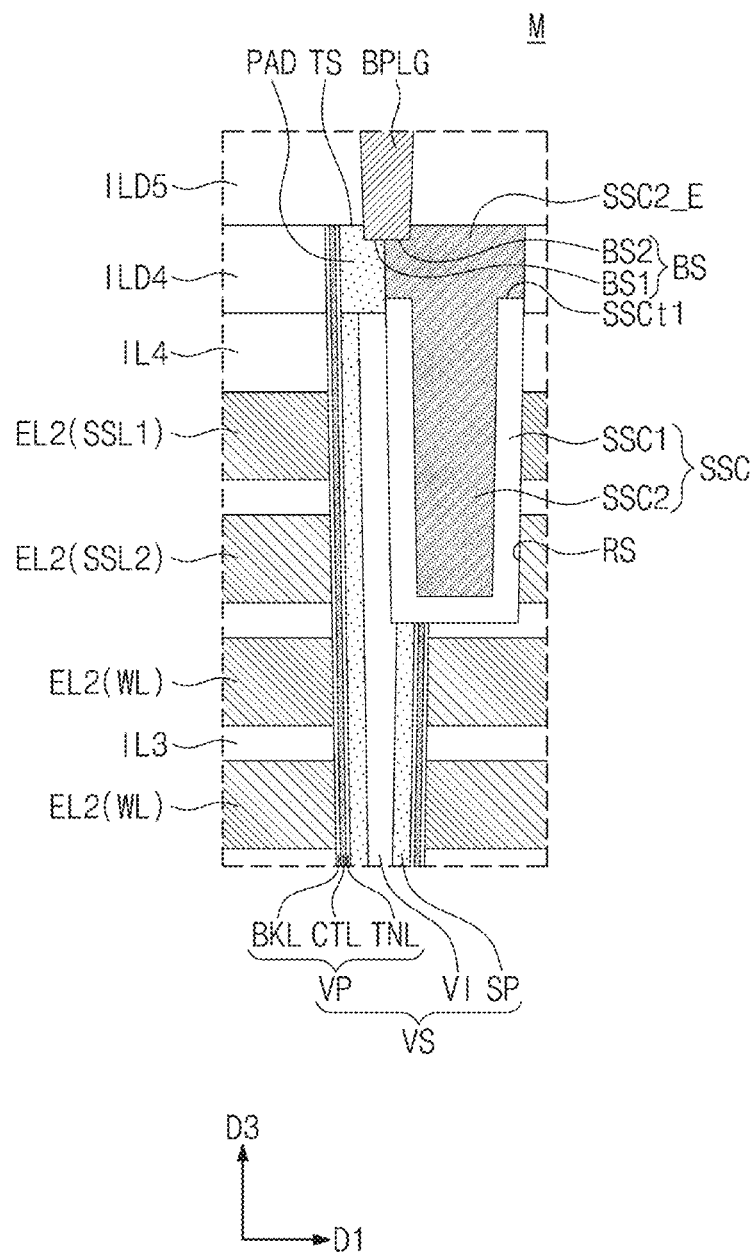

Referring to FIG. 19, the top surface SSCt1 of the first cutting layer SSC1 may be located at a level between the top surface TS and the bottom surface of the conductive pad PAD. The second cutting layer SSC2 may be provided to fill an upper portion of the recess RS, and in this case, the second cutting layer SSC2 may include an expanded portion SSC2_E provided as its upper portion. The expanded portion SSC2_E may cover the top surface SSCt1 of the first cutting layer SSC1. A width of the expanded portion SSC2_E may be larger than a width of a portion of the second cutting layer SSC2 thereunder.

The expanded portion SSC2_E may be in direct contact with the conductive pad PAD. The bit line contact BPLG may be in contact with the conductive pad PAD and the expanded portion SSC2_E. The first bottom surface BS1 of the bit line contact BPLG may be in contact with the conductive pad PAD, and the second bottom surface BS2 may be in contact with the expanded portion SSC2_E. In some example embodiments, due to the expanded portion SSC2_E, the second cutting layer SSC2 may be used as a stopper more effectively preventing or reducing the likelihood of and/or impact from the vertical protruding portion VPP of FIG. 8 from being formed.

Figure 20:
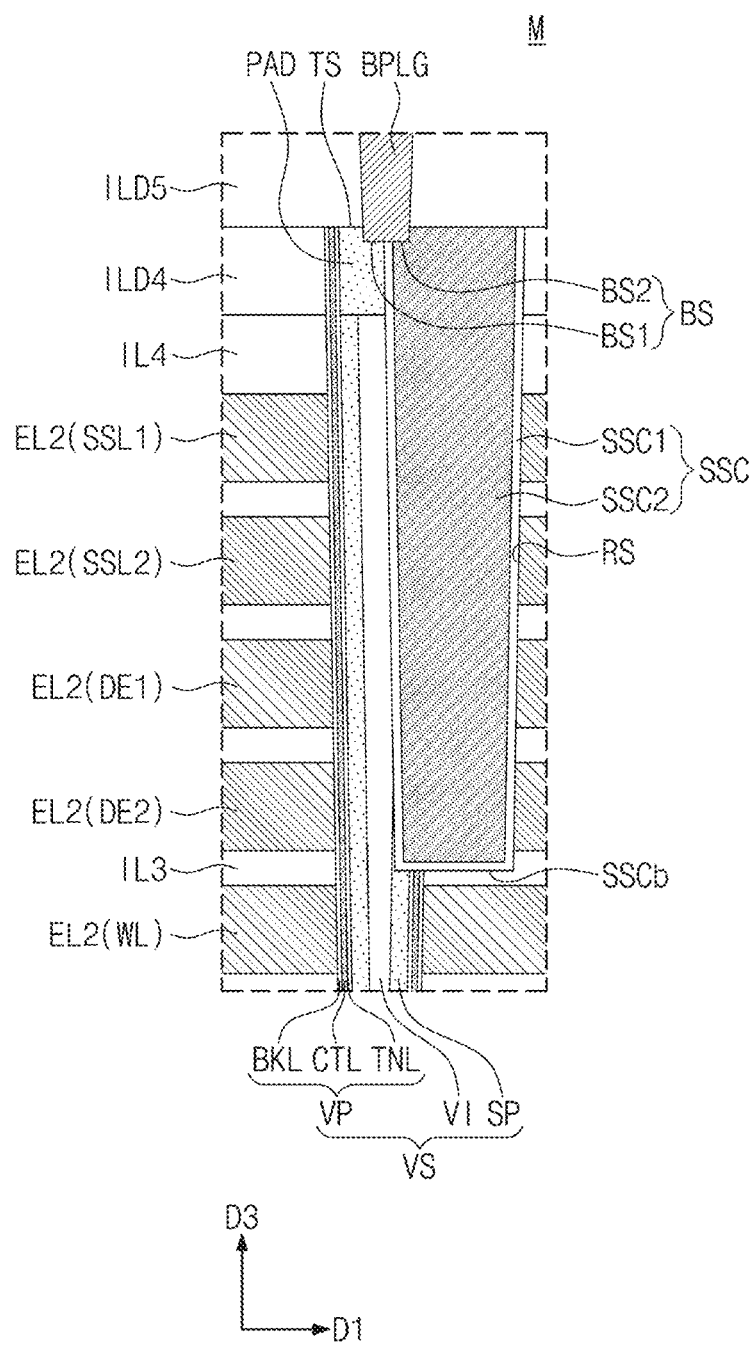

Referring to FIG. 20, the second electrode EL2 below the second string selection line SSL2 may be or correspond to a first dummy electrode DE1, and the second electrode EL2 below the first dummy electrode DE1 may be or correspond to a second dummy electrode DE2. The word lines WL may be provided below the second dummy electrode DE2. For example, at least one dummy electrode DE1 or DE2 may be provided between the second string selection line SSL2 and the word line WL. The first and second dummy electrodes DE1 and DE2 may not be electrically active during operation of the semiconductor device 1100, e.g. the first and second dummy electrodes DE1 and DE2 may be floating during operation of the semiconductor device 1100.

The cutting structure SSC may be provided to penetrate not only the first and second string selection lines SSL1 and SSL2 but also the first and second dummy electrodes DE1 and DE2. The bottom surface SSCb of the cutting structure SSC may be located at a level between the second dummy electrode DE2 and the word line WL.

According to some example embodiments of inventive concepts, a cutting structure may include first and second cutting layers, which are formed of different materials, not a single insulating layer. The second cutting layer may prevent or reduce the likelihood of and/or impact from a bit line contact from having a vertical protruding portion, which serves as a process defect such as a punch-through defect. For example, according to some example embodiments of inventive concepts, it may be possible to prevent or reduce the likelihood of and/or impact from the process failure occurring in the bit line contact and thereby to improve reliability of a semiconductor device. Alternatively or additionally, even when a vertical channel structure is formed to be overlapped with a portion of the cutting structure, the vertical channel structure may still be effectively used as a channel region, and in this case, the semiconductor device may be fabricated to have an increased integration density.

Any of the elements disclosed above may include and/or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc While some example embodiments of inventive concepts have been particularly shown and described, it will be understood by one of ordinary skill in the art that variations in form and detail may be made therein without departing from the spirit and scope of the attached claims. Additionally example embodiments are not necessarily mutually exclusive with one another. For example, some example embodiments may include features described with reference to one or more figures, and may also include other features described with reference to one or more other figures.

What is claimed is:

1. A semiconductor device, comprising:
a substrate;
a cell array structure on the substrate, the cell array structure comprising a plurality of electrodes and a plurality of insulating layer alternately stacked, an uppermost one of the plurality of electrodes corresponding to a first string selection line;
a vertical channel structure penetrating the cell array structure and connected to the substrate;
a conductive pad in an upper portion of the vertical channel structure;
a bit line on the cell array structure;
a bit line contact electrically connecting the bit line to the conductive pad;
a recess penetrating the electrode corresponding to the first string selection line; and
a cutting structure disposed in the recess,
wherein the cutting structure penetrates a portion of the conductive pad,
the cutting structure comprises a first cutting layer disposed on a side surface and a bottom surface of the recess and a second cutting layer disposed on the first cutting layer, and
the second cutting layer comprises a material having an etch selectivity with respect to the first cutting layer.

2. The semiconductor device of claim 1, wherein the second cutting layer comprises an expanded portion as an upper portion of the second cutting layer,
the expanded portion contacts the conductive pad, andc
the expanded portion covers a top surface of the first cutting layer.

3. The semiconductor device of claim 1, wherein
a bottom surface of the bit line contact comprises a first bottom surface contacting the conductive pad, and a second bottom surface contacting the cutting structure.

4. The semiconductor device of claim 3, wherein the first bottom surface is at a level that is different from the second bottom surface.

5. The semiconductor device of claim 3, wherein the second bottom surface contacts the second cutting layer.

6. The semiconductor device of claim 1, wherein one electrode, which is one of the plurality of electrodes and is below the first string selection line, corresponds to a second string selection line, and
the cutting structure further penetrates the electrode corresponding to the second string selection line.

7. The semiconductor device of claim 6, wherein one electrode, which is one of the plurality of electrodes and is below the second string selection line, is a dummy electrode,
an electrode, which is another one of the plurality of electrodes and is below the dummy electrode, corresponds to a word line,
the cutting structure further penetrates the dummy electrode, and
a bottom surface of the cutting structure is at a level between the dummy electrode and the electrode that corresponds to the word line.

8. The semiconductor device of claim 1, wherein the substrate comprises a lower semiconductor layer, a source semiconductor layer, and an upper semiconductor layer, the lower semiconductor layer, the source semiconductor layer, and the upper semiconductor layer being sequentially stacked, and
the vertical channel structure is connected to the source semiconductor layer.

9. The semiconductor device of claim 1, further comprising:
a lower level layer, which is below the substrate and includes a peripheral circuit.

10. The semiconductor device of claim 1, wherein the vertical channel structure comprises:
a vertical semiconductor pattern connected to the substrate; and
a vertical insulating pattern between the plurality of electrodes and the vertical semiconductor pattern,
wherein the vertical insulating pattern comprises a charge storing layer.

11. A semiconductor device, comprising:
a substrate;
a cell array structure on the substrate, the cell array structure comprising a plurality of electrodes which are stacked to be spaced apart from each other, an uppermost one of the plurality of electrodes corresponding to a string selection line;
vertical channel structures provided to penetrate the cell array structure and connected to the substrate; and
a cutting structure provided to penetrate the string selection line,
wherein the cutting structure has a line shape extending in a first direction,
the vertical channel structures arranged in the first direction constitute rows, the rows comprise a first row and a second row, which are adjacent to each other in a second direction with the cutting structure interposed between the first row and the second row, and the second direction crosses the first direction, the cutting structure vertically overlaps a portion of each of the vertical channel structures of the first row, the cutting structure vertically overlaps a portion of each of the vertical channel structures of the second row, the cutting structure comprises a first cutting layer and a second cutting layer disposed on the first cutting layer, and each of the first cutting layer and the second cutting layer extends from one to another among the vertical channel structures of the first row.

12. The semiconductor device of claim 11, wherein the vertical channel structures of the first row are respectively offset from the vertical channel structures of the second row in the first direction.

13. The semiconductor device of claim 11, further comprising:

conductive pads, which are respectively in upper portions of the vertical channel structures of the first and second rows, wherein the cutting structure penetrates a portion of each of the conductive pads.

14. The semiconductor device of claim 13, further comprising:

a bit line on one of the vertical channel structures of the first row; and a bit line contact electrically connecting the bit line to the one of the vertical channel structures, wherein a portion of the bit line contact is in contact with the cutting structure.

15. The semiconductor device of claim 11, wherein each of the vertical channel structures comprises:

a vertical semiconductor pattern connected to the substrate; and a vertical insulating pattern between the plurality of electrodes and the vertical semiconductor pattern, wherein the vertical insulating pattern comprises a charge storing layer.

16. An electronic system, comprising:

a semiconductor device including an input/output pad, which is electrically connected to peripheral circuits; and a controller electrically connected to the semiconductor device through the input/output pad and configured to control the semiconductor device, wherein the semiconductor device comprises:

a lower level layer including a first substrate and the peripheral circuits on the first substrate, and an upper level layer on the lower level layer, wherein the upper level layer includes:

a second substrate on the lower level layer, a cell array structure on the second substrate, the cell array structure comprising a plurality of electrodes and a plurality of insulating layer alternately stacked, an uppermost one of the plurality of electrodes corresponding to a string selection line, a vertical channel structure penetrating the cell array structure and connected to the second substrate, a recess penetrating the string selection line, and a cutting structure disposed in the recess, wherein the cutting structure comprises a first insulating layer disposed on a side surface and a bottom surface of the recess and a second insulating layer on the first insulating layer, and the second insulating layer comprises a material having an etch selectivity with respect to the first insulating layer.

17. The electronic system of claim 16, wherein the upper level layer further comprises a conductive pad in an upper portion of the vertical channel structure, the cutting structure penetrates a portion of the conductive pad, and the cutting structure vertically overlaps a portion of the vertical channel structure.

18. The electronic system of claim 17, wherein the upper level layer further comprises:

a bit line on the cell array structure; and a bit line contact electrically connecting the bit line to the conductive pad, wherein a bottom surface of the bit line contact comprises a first bottom surface contacting the conductive pad, and a second bottom surface contacting with the cutting structure.

19. The electronic system of claim 18, wherein the first bottom surface is at a level different from the second bottom surface.

20. The electronic system of claim 16, wherein the vertical channel structure comprises:

a vertical semiconductor pattern connected to the second substrate; and a vertical insulating pattern between the plurality of electrodes and the vertical semiconductor pattern, wherein the vertical insulating pattern comprises a charge storing layer.

\* \* \* \* \*